(12) United States Patent
Kumagai et al.

(10) Patent No.: US 6,570,264 B2
(45) Date of Patent: May 27, 2003

(54) SEMICONDUCTOR MEMORY DEVICE

(75) Inventors: Takashi Kumagai, Chino (JP);
Masahiro Takeuchi, Chino (JP);
Satoru Kodaira, Chino (JP); Takafumi Noda, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 83 days.

(21) Appl. No.: 09/876,056

(22) Filed: Jun. 8, 2001

(65) Prior Publication Data
US 2002/0008266 A1 Jan. 24, 2002

(30) Foreign Application Priority Data
Jun. 15, 2000 (JP) ........................................ 2000-179977

(51) Int. Cl.[7] .............................................. H01L 27/11
(52) U.S. Cl. ........................ 257/903; 257/904; 257/903
(58) Field of Search ................................. 257/903–904, 257/393

(56) References Cited

U.S. PATENT DOCUMENTS 6,093,597 A * 7/2000 Hayashi ...................... 438/152
6,160,298 A * 12/2000 Ohkubo ...................... 257/393

FOREIGN PATENT DOCUMENTS

JP    A 10-41409    2/1998

OTHER PUBLICATIONS

M. Ishida et al., IEDM Technical Digest, 1998.
U.S. patent application Ser. No. 09/876,068, Kumagai et al., filed Jun. 8, 2001.
U.S. patent application Ser. No. 09/876,058, Kumagai et al., filed Jun. 8, 2001.
U.S. patent application Ser. No. 09/876,059, Kumagai et al., filed Jun. 8, 2001.

* cited by examiner

*Primary Examiner*—Cuong Quang Nguyen
(74) *Attorney, Agent, or Firm*—Oliff & Berridge, PLC

(57) ABSTRACT

The invention provides SRAMs that can reduce memory cells in size and correct light proximity effect. Gate electrode layers in a first layer, drain—drain connection layers in a second layer, and drain-gate connection layers in a third layer define conduction layers of a flip-flop. The drain-gate connection layer has an extension section extending in a direction toward the drain-gate connection layer. The drain-gate connection layer 41b has an extension section extending in a direction toward the drain-gate connection layer.

11 Claims, 16 Drawing Sheets

SEMICONDUCTOR MEMORY DEVICE

BACKGROUND OF THE INVENTION

1. Field of Invention

The present invention relates to semiconductor memory devices such as SRAMs (static random access memories).

2. Description of Related Art

SRAMs, one type of semiconductor memory devices, do not require a refreshing operation, and therefore have characteristics that can simplify a system in which they are incorporated and facilitate lower power consumption. For this reason, the SRAMs are prevailingly used as memories for hand-carry type equipment, such as cellular phones.

In manufacturing SRAMs, first, mask patterns are made based on patterns that are designed by the designers. Resists are exposed using the mask patterns to make resist patterns. Using the resist patterns, conduction layers and the like formed on a semiconductor substrate are selectively etched to form patterns for a memory circuit on the semiconductor substrate.

In the manufacturing of the SRAM described above, when a mask pattern is completely identical with a designed pattern, a resist pattern is not formed faithfully with respect to the designed pattern due to light proximity effect. In particular, narrow end sections of wirings have small focusing margins in the exposure and they cause rounded or receded end sections in the resist pattern. Also, when contact holes are located in end sections of wirings, problems occur. For example, an enclosure (an extra coverage for the wiring above or below the contact hole) of the contact deteriorates, which results in an increased resistance, opens the connection, and causes other problems. For this reason, mask patterns, with the light proximity effect being corrected with respect to the designed patterns, are used. However, patterns with finely corrected measurements are required to correct the light proximity effect, and therefore the cost for the masks increases. Also, steps for confirming the corrected patterns are required, which result in a longer period for developing SRAMs and an increase in development costs.

Also, hand-carry type equipment on which SRAMs are mounted need to be reduced in size, and therefore the memory size of the SRAMs must be reduced.

SUMMARY OF THE INVENTION

It is an object of the present invention to provide a highly reliable semiconductor memory device that enhances manufacturing and reproducibility of wiring patterns.

It is another object of the present invention to provide a semiconductor memory device that can alleviate the correction of the light proximity effect.

It is a further object of the present invention to provide a semiconductor memory device that can reduce the size of memory cells.

In accordance with the present invention, a semiconductor memory device has a memory cell that includes a first driver transistor, a second driver transistor, a first load transistor, a second load transistor, a first transfer transistor and a second transfer transistor. The semiconductor device includes a first drain—drain connection layer and a second drain—drain connection layer. The first drain—drain connection layer connects a drain region of the first driver transistor and a drain region of the first load transistor. The second drain—drain connection layer connects a drain region of the second driver transistor and a drain region of the second load transistor. Each of the first drain—drain connection layer and the second drain—drain connection layer includes a first contact end section, a second contact end section, a linear section and an extension section. The first contact end section of the first drain—drain connection layer is a portion that connects to the drain region of the first driver transistor. The second contact end section of the first drain—drain connection layer is a portion that connects to the drain region of the first load transistor. The linear section of the first drain—drain connection layer is a portion that linearly extends from the first contact end section of the first drain—drain connection layer and reaches the second contact end section of the first drain—drain connection layer. The extension section of the first drain—drain connection layer is a portion that extends from the second contact end section of the first drain—drain connection layer in a direction toward a location where the second drain—drain connection layer is located. The first contact end section of the second drain—drain connection layer is a portion that connects to the drain region of the second driver transistor. The second contact end section of the second drain—drain connection layer is a portion that connects to the drain region of the second load transistor. The linear section of the second drain—drain connection layer is a portion that linearly extends from the first contact end section of the second drain—drain connection layer and reaches the second contact end section of the second drain—drain connection layer. The extension section of the second drain—drain connection layer is a portion that extends from the second contact end section of the second drain—drain connection layer in a direction toward a location where the first drain—drain connection layer is located.

In accordance with the present invention, the extension section prevents the second contact end sections of the drain—drain connection layer from being rounded or receded. Therefore, the enclosure of a contact hole disposed at the second contact end section is prevented from deterioration. Accordingly, in accordance with the present invention, process margins for a semiconductor memory device and its reliability can be enhanced.

Also, in accordance with the present invention, the extension sections correct the light proximity effect. Therefore, devices, such as shelves or the like to correct the light proximity effect, do not need to be added to the second contact end section of the second drain—drain connection layer. Accordingly, the correction of the light proximity effect can be alleviated, and the cost for semiconductor memory devices can be accordingly reduced.

In accordance with the present invention, another conduction layer is not located between the extension section of the first drain—drain connection layer and the extension section of the second drain—drain connection layer. In accordance with the present invention, since other conduction layers are not located in the region described above, the extension section can be formed without enlarging the area of the memory cell.

In accordance with the present invention, a distance between the first contact end section of the first drain—drain connection layer and the first contact end section of the second drain—drain connection layer is longer than a distance between the extension section of the first drain—drain connection layer and the extension section of the second drain—drain connection layer. In accordance with the present invention, the distance between the first contact end section of the first drain—drain connection layer and the first contact end section of the second drain—drain connection layer is relatively long, such that another conduction layer can be disposed in a region between them.

The present invention includes a first gate electrode layer, a second gate electrode layer, a first drain-gate connection layer and a second drain-gate connection layer. The gate electrode layers, the drain—drain connection layers and the drain-gate connection layers are located in different layers. In plan view, the first gate electrode layer and the second gate electrode layer are located between the first drain—drain connection layer and the second drain—drain connection layer. The first gate electrode layer includes a gate electrode of the first driver transistor and a gate electrode of the first load transistor. The second gate electrode layer includes a gate electrode of the second driver transistor and a gate electrode of the second load transistor. The first drain-gate connection layer connects the first drain—drain connection layer. The second gate electrode layer, and the second drain-gate connection layer connects the second drain—drain connection layer and the first gate electrode layer.

The present invention is equipped with gate electrode layers that become gates of inverters, drain—drain connection layers that connect drains of the inverters, and drain-gate connection layers that connect gates of one of the inverters and drains of the other of the inverters. A semiconductor memory device in accordance with the present invention uses three layers (gate electrode layers, drain—drain connection layers, and drain-gate connection layers) to form flip-flops. Accordingly, patterns in each layer can be simplified (for example, into linear patterns) compared to the case in which flip-flops are formed using two layers. In this manner, in the semiconductor memory device in accordance with the present invention, the patterns in each layer can be simplified. As a result, a miniaturized semiconductor memory device with its memory cell size being 4.5 $\mu m^2$ or smaller, for example, can be manufactured.

Also, in accordance with the present invention, in plan view, the first and second gate electrode layers are located between the first drain—drain connection layer and the second drain—drain connection layer. As a result, the source contact layer of the driver transistors can be disposed in the central area of the memory cell. Furthermore, wirings that are located in the same layer as the drain—drain connection layers and to be connected to the source contact layers can be disposed in the center of the memory cell. Accordingly, the degree of freedom in forming the first and second drain-gate connection layers increases. This is also advantageous with regard to reducing the memory cell size.

Also, in accordance with the present invention, the source region of the two driver transistors within a memory cell can be disposed in the central area of the memory cell, and the source contact layer can be commonly used within the cell. As a result, increases in the source potential, that may be caused by the source contact parasitic resistance, can be made uniform without regard to read data, and therefore a highly stable semiconductor memory device can be realized.

In accordance with the present invention, the first drain—drain connection layer is connected to the first drain-gate connection layer at the second contact end section of the first drain—drain connection layer, and the second drain—drain connection layer is connected to the second drain-gate connection layer at the first contact end section of the second drain—drain connection layer. In accordance with the present invention, the positions of contacts that connect the drain—drain connection layers to the drain-gate connection layers can be separated from the cell center and from one another diagonally across the cell center. Accordingly, the drain-gate connection layer can be formed in a simple pattern in an L-letter shape. As a result, while the cell area is reduced, the processing rule for making the drain-gate connection layers can be lightened.

In accordance with the present invention, the first contact end section of the second drain—drain connection layer is wider than the first contact end section of the first drain—drain connection layer, and the extension section of the second drain—drain connection layer is shorter than the extension section of the first drain—drain connection layer. In accordance with the present embodiment, the enclosure of a contact that connects the drain—drain connection layer to the drain-gate connection layer can be expanded, and a greater margin for positioning can be obtained.

In accordance with the present invention, the first drain—drain connection layer is connected to the first drain-gate connection layer at the first contact end section of the first drain—drain connection layer, and the second drain—drain connection layer is connected to the second drain-gate connection layer at the second contact end section of the second drain—drain connection layer. In accordance with the present invention, the positions of contacts that connect the drain—drain connection layers to the drain-gate connection layers can be separated from one another diagonally across and from the cell center. Accordingly, the drain-gate connection layer can be provided with a simple pattern in an L-letter shape. As a result, the processing rule for making the drain-gate connection layers can be eased without reducing the cell area.

In accordance with the present invention, the first contact end section of the first drain—drain connection layer is wider than the first contact end section of the second drain—drain connection layer, and the extension section of the first drain—drain connection layer is shorter than the extension section of the second drain—drain connection layer. In accordance with the present embodiment, the enclosure of a contact that connects the drain—drain connection layer to the drain-gate connection layer can be expanded, and a greater margin for positioning can be obtained.

In accordance with the present invention, each of the first gate electrode layer and the second gate electrode layer has a linear pattern. The first gate electrode layer, the second gate electrode layer, the linear section of the first drain—drain connection layer, and the linear section of the second drain—drain connection layer are disposed in parallel with one another. In accordance with the present embodiment, the patterns are simple, and therefore a semiconductor memory device with a very small memory cell size can be realized.

In accordance with the present invention, the first and second driver transistors are n-type, the first and second load transistors are p-type, and the first and second transfer transistors are n-type. The present invention further includes first, second, third and fourth conduction layers. The first gate electrode layer, the second gate electrode layer and an auxiliary word line are located in the first conduction layer. The first drain—drain connection layer, the second drain—drain connection layer, a power supply line, a first contact pad layer, a second contact pad layer and a third contact pad layer are located in the second conduction layer. The first drain-gate connection layer, the second drain-gate connection layer, a main word line, a fourth contact pad layer, a fifth contact pad layer and a sixth contact pad layer are located in the third conduction layer. A first bit line, a second bit line and a grounding line are located in the fourth conduction layer. The auxiliary word line extends in a first direction. The power supply line connects to source regions of the load transistors. The first contact pad layer is used to connect the first bit line and a source/drain region of the first transfer transistor. The second contact pad layer is used to connect the second bit line and a source/drain region of the second transfer transistor. The third contact pad layer is used to connect source regions of the driver transistors and the grounding line. The main word line extends in the first direction. The fourth contact pad layer is used to connect the first bit line and a source/drain region of the first transfer transistor. The fifth contact pad layer is used to connect the second bit line and a source/drain region of the second transfer transistor. The sixth contact pad layer is used to connect source regions of the driver transistors and the grounding line. The first and second bit lines extend in a second direction that is perpendicular to the first direction.

In accordance with the present invention, a variety of characteristics required for semiconductor memory devices (for example, reduced size, reliability, stability and speed) can be enhanced in a well-balanced manner.

DETAILED DESCRIPTION OF PREFERRED EMBODIMENTS

A semiconductor memory device in accordance with one embodiment of the present invention is described. In this embodiment, the semiconductor memory device of the present invention is applied to an SRAM. First, a general structure of the embodiment of the present invention is described. Then, the structure is described in detail, and lastly, advantages of the present embodiment are described.

[General Structure of the Present Embodiment]

A semiconductor memory device in accordance with the present embodiment is a type that forms one memory cell with six MOS field effect transistors. A part of the structure that forms flip-flops of the memory cell and the structure of the memory cell are separately described to show the general structure of the present embodiment.

{Structure of Part that Forms Flip-Flops of Memory Cell}

Figure 1:
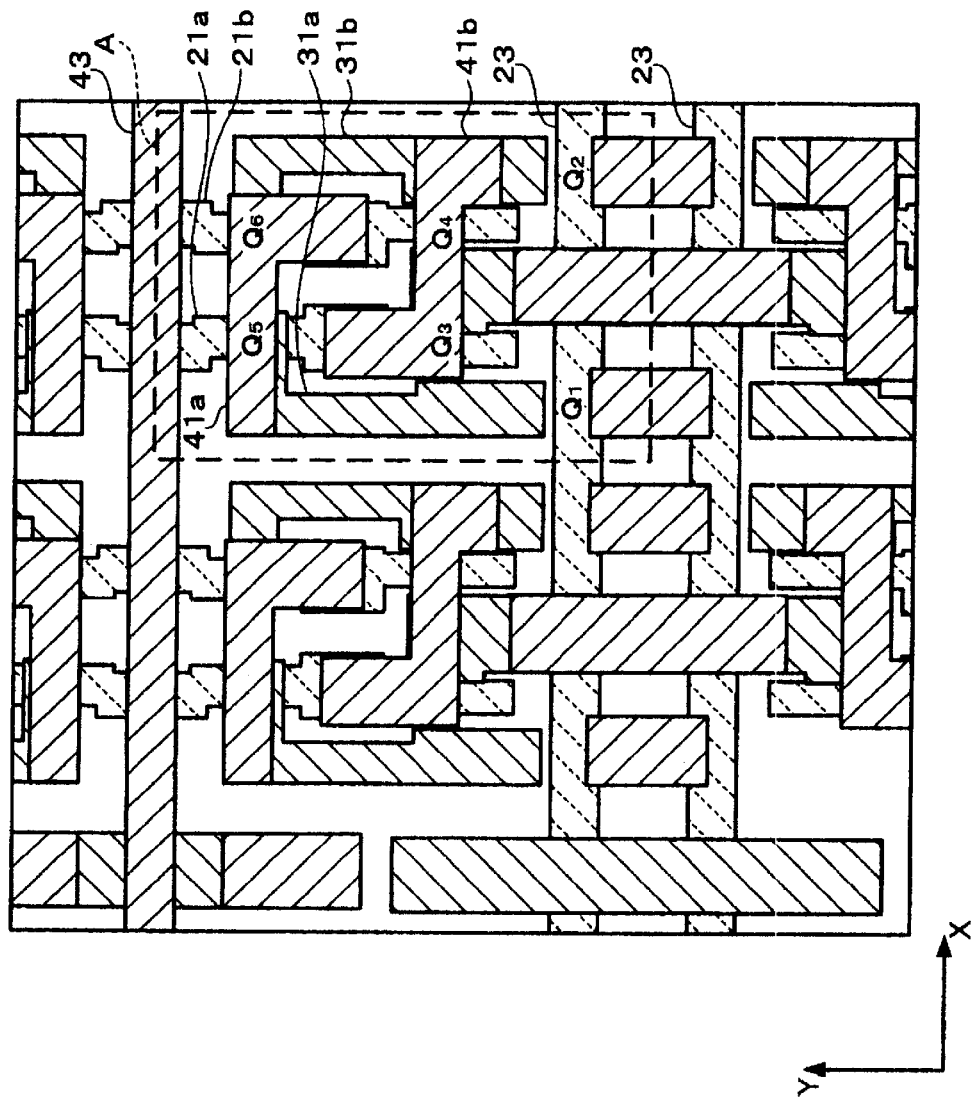
FIG. 1 is a plan view of first, second and third conduction layers in a part of a memory cell array in accordance with one embodiment of the present invention.

FIG. 1 is a plan view of part of a memory cell array in accordance with the present embodiment including first, second and third conduction layers. To facilitate understanding of FIG. 1, the first, second and third layers are individually described first.

Figure 3:
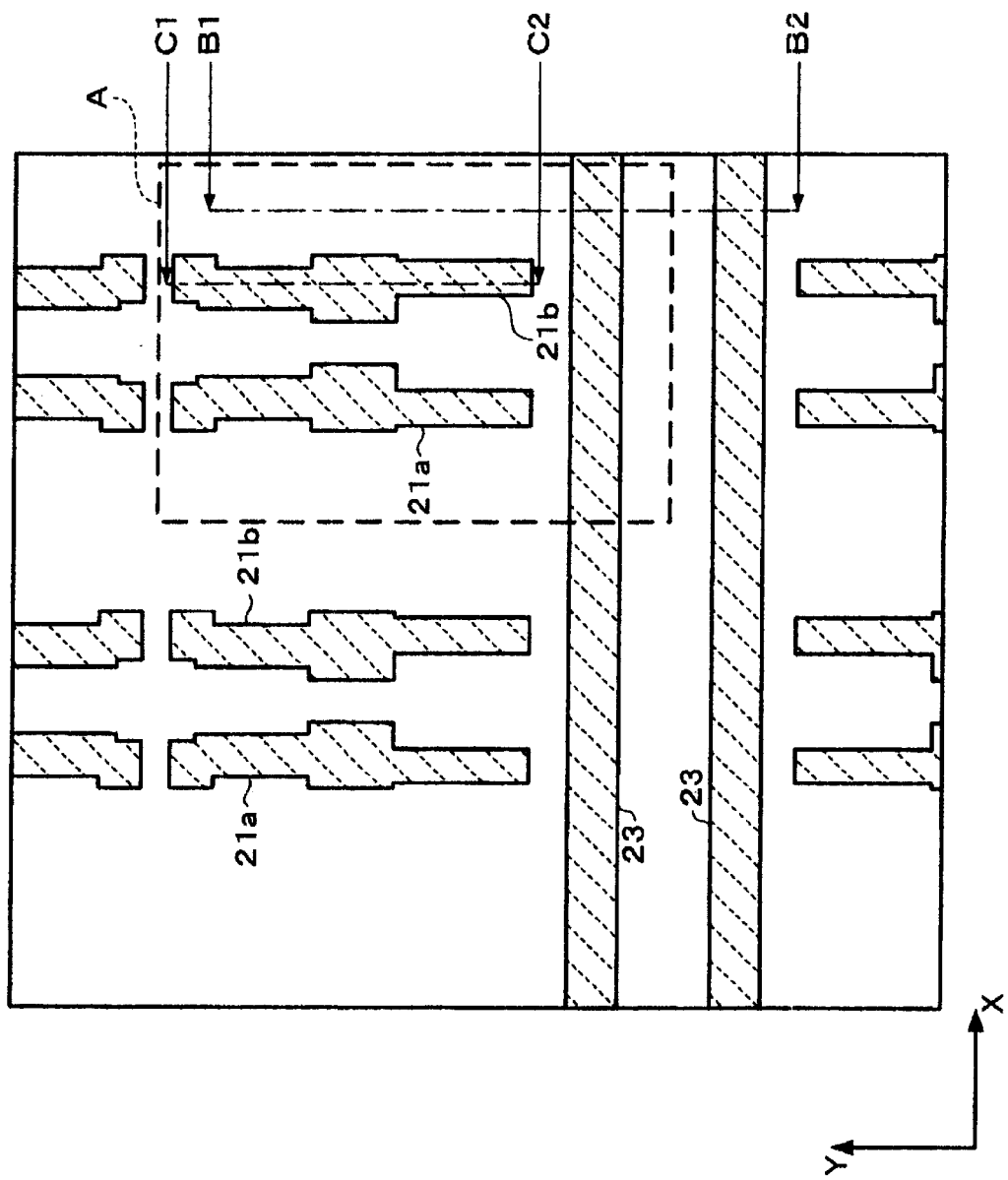
FIG. 3 is a plan view of a first conduction layer in a part of the memory cell array in accordance with one embodiment of the present invention.
Figure 5:
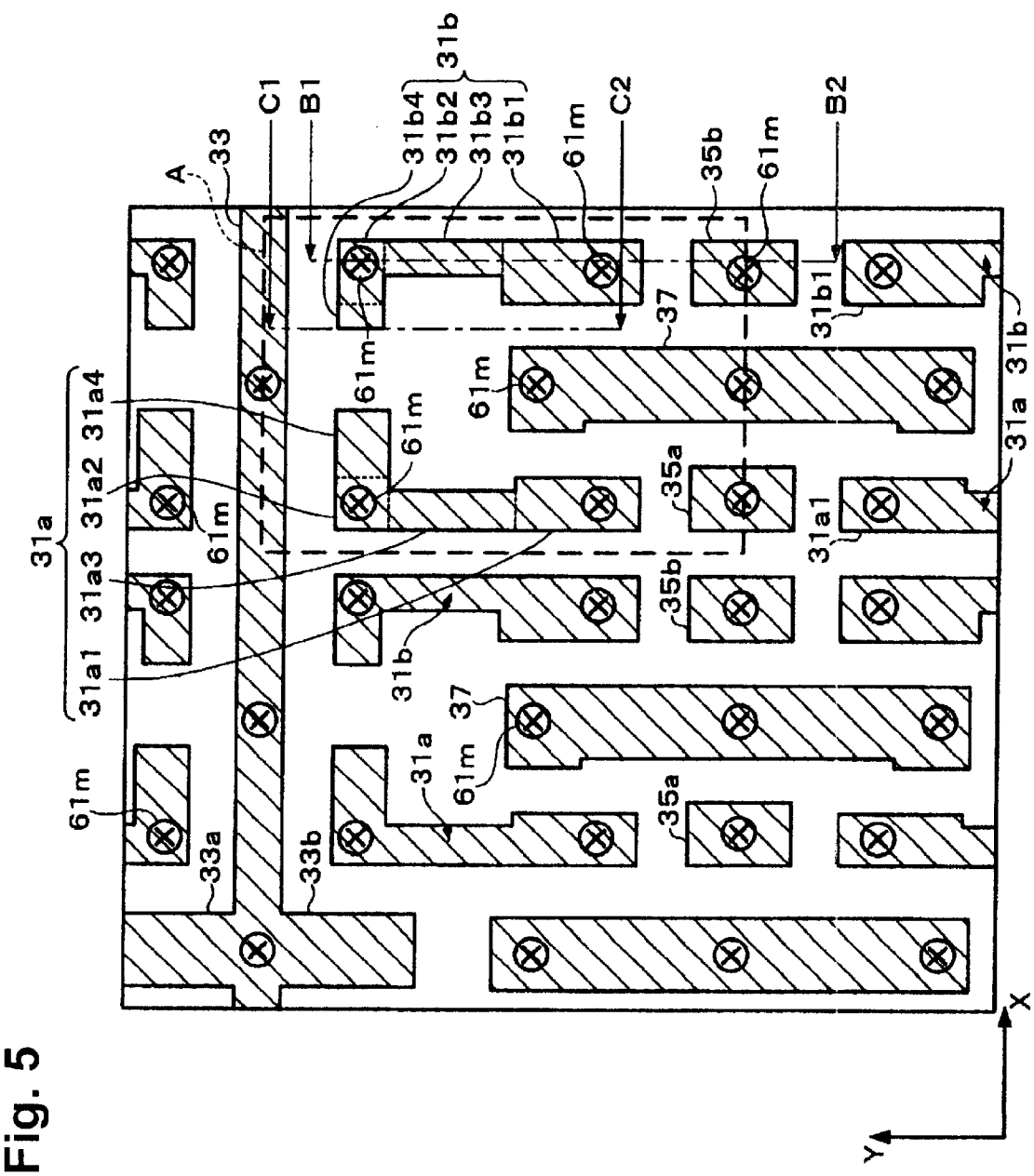
FIG. 5 is a plan view of a second conduction layer in a part of the memory cell array in accordance with one embodiment of the present invention.
Figure 8:
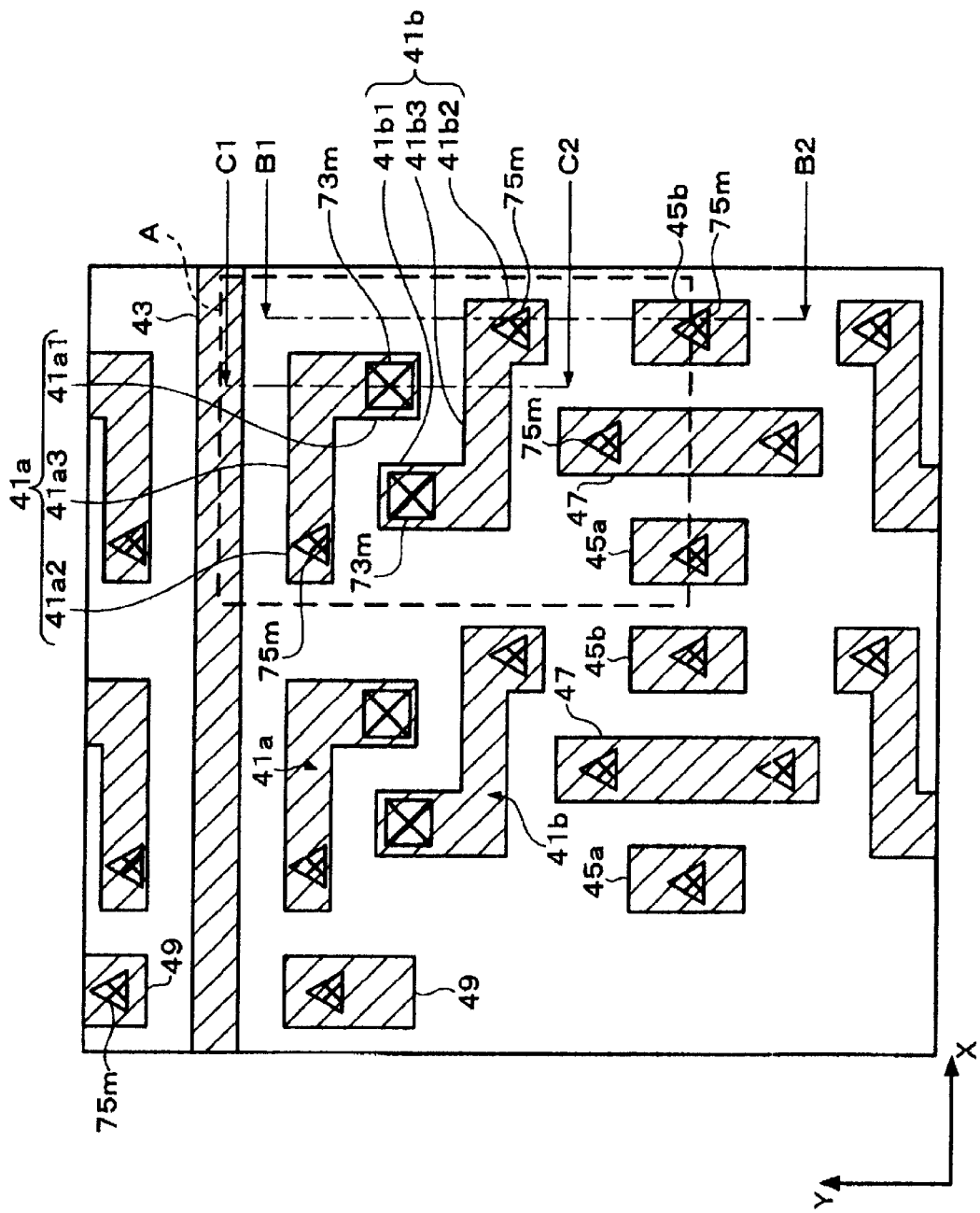
FIG. 8 is a plan view of a third conduction layer in a part of the memory cell array in accordance with one embodiment of the present invention.
Figure 9:
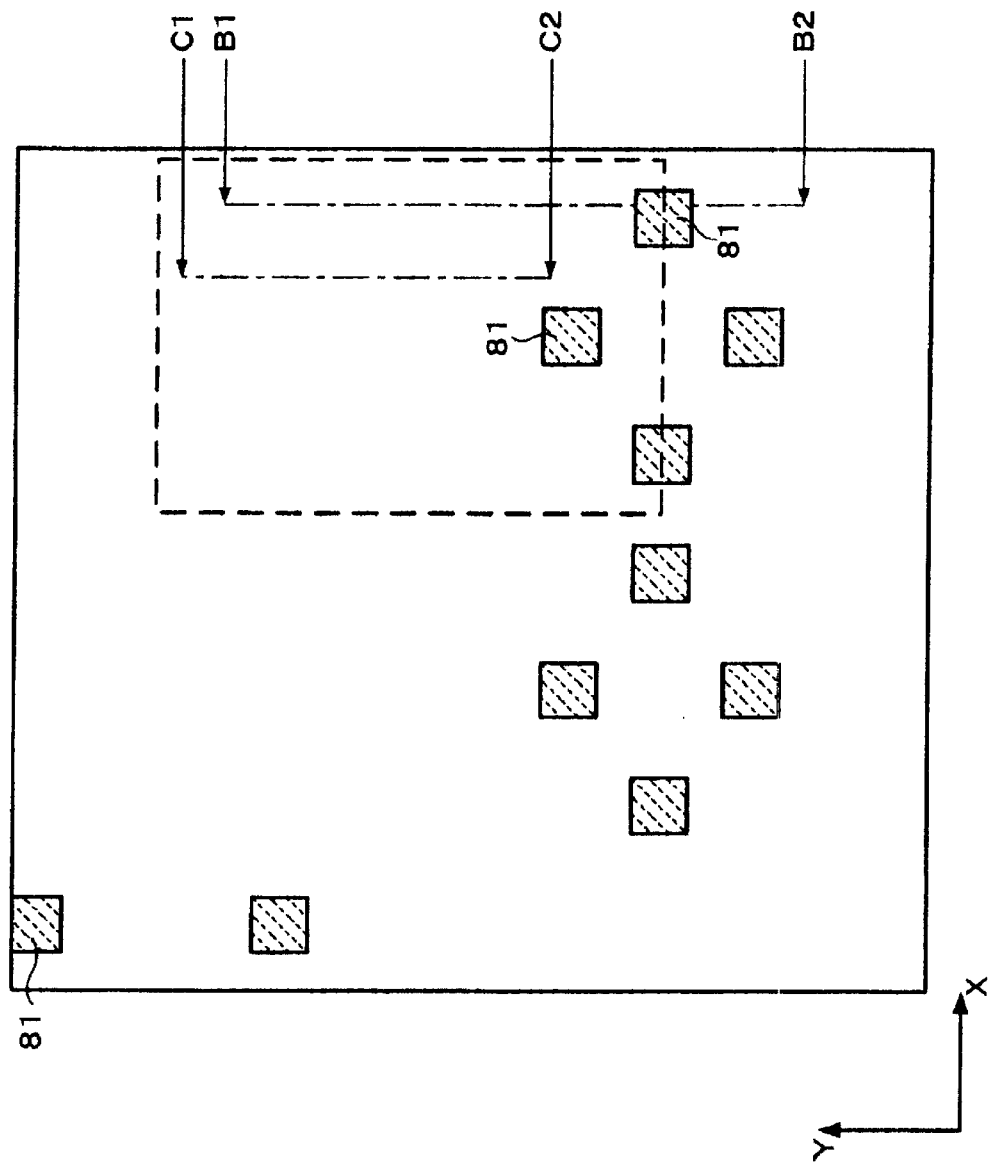
FIG. 9 is a plan view of a plug 81 in a part of the memory cell array in accordance with one embodiment of the present invention.

As shown in FIG. 3, gate electrode layers 21a and 21b and auxiliary word lines 23 are disposed in the first layer. As shown in FIG. 5, drain—drain connection layers 31a and 31b are disposed in the second layer. As shown in FIG. 8, drain-gate connection layers 41a and 41b are disposed in the third layer. A structure shown in FIG. 5 is located above the structure shown in FIG. 3, and a structure shown in FIG. 8 is located above the structure shown in FIG. 5. FIG. 1 shows these structures in one figure.

FIG. 1 shows a portion that forms a flip-flop. This is described focusing on a region A. The region A is a region where one memory cell is formed. The region A in the other figures has the same meaning.

Figure 16:
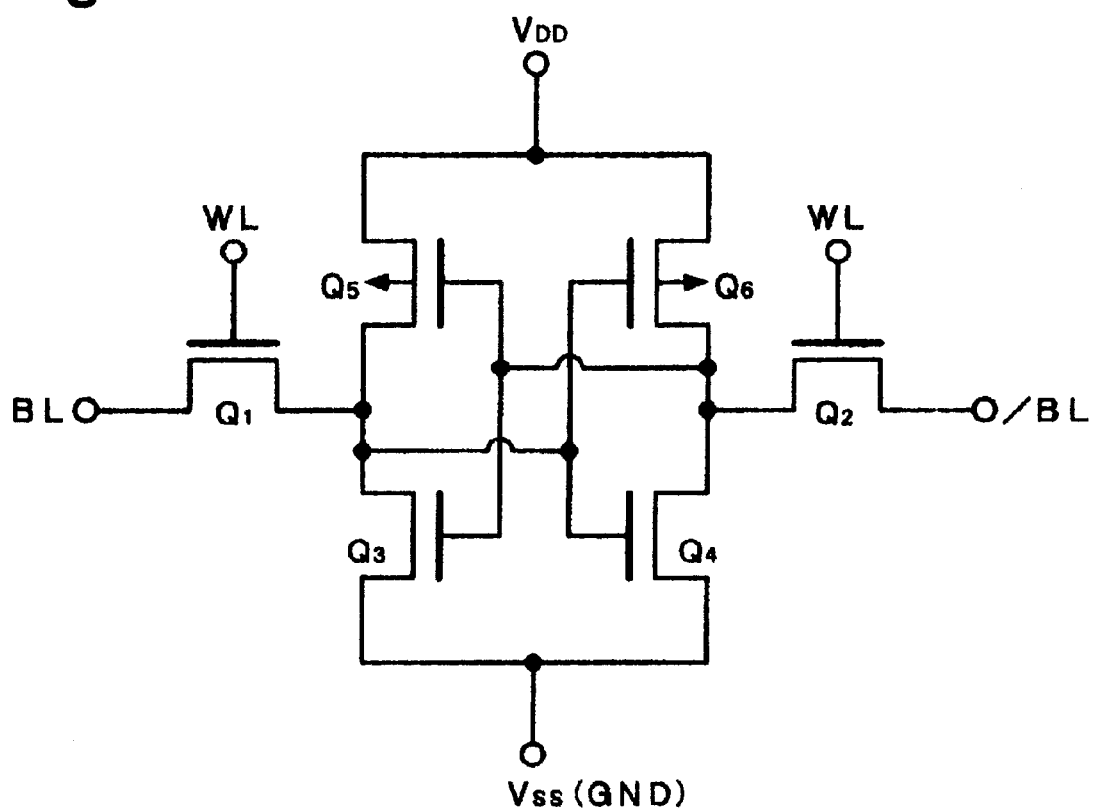
FIG. 16 is an equivalent circuit of an SRAM in accordance with one embodiment of the present invention.

In the region A, six MOS field effect transistors, namely, n-channel type transfer transistors $Q_1$ and $Q_2$, n-channel type driver transistors $Q_3$ and $Q_4$, and p-channel type load transistors $Q_5$ and $Q_6$ are formed. The driver transistor $Q_3$ and the load transistor $Q_5$ form one CMOS inverter. Also, the driver transistor $Q_4$ and the load transistor $Q_6$ form one CMOS inverter. These two CMOS inverters are cross-coupled to form a flip-flop. A circuit that is formed by the six MOS field effect transistors in Region A can be represented by an equivalent circuit shown in FIG. 16.

Referring to FIG. 1 again, the gate electrode layer 21a and the gate electrode layer 21b have linear patterns, respectively. The gate electrode layer 21a forms gate electrodes of the driver transistor $Q_3$ and the load transistor $Q_5$, and also connects these electrodes to one another. Also, the gate electrode layer 21b forms gate electrodes of the driver transistor $Q_4$ and the load transistor $Q_6$, and further connects these electrodes to one another.

A drain region of the driver transistor $Q_3$ and a drain region of the load transistor $Q_5$ are connected by the drain—drain connection layer 31a. Also, a drain region of the driver transistor $Q_4$ and a drain region of the load transistor $Q_6$ are connected by the drain—drain connection layer 31b. The drain—drain connection layer 31a and the drain—drain connection layer 31b have linear patterns, respectively.

Gate electrodes (the gate electrode layer 21a) of the driver transistor $Q_3$ and the load transistor $Q_5$ and the drain—drain connection layer 31b are connected by the drain-gate connection layer 41b. Also, gate electrodes (the gate electrode layer 21b) of the driver transistor $Q_4$ and the load transistor $Q_6$ and the drain—drain connection layer 31a are connected by the drain-gate connection layer 41a. The drain-gate connection layer 41a and the drain-gate connection layer 41b have patterns in a letter-L shape, respectively. A first side and a second side of each of the L-letter patterns generally form an angle of 90 degrees. The first side of the drain-gate connection layer 41a is opposed to the first side of the drain-gate connection layer 41b. The second side of the drain-gate connection layer 41a is opposed to the second side of the drain-gate connection layer 41b. The drain-gate connection layer 41a and the drain-gate connection layer 41b are generally symmetrical about a point.

The gate electrode layer 21a, the gate electrode layer 21b, the drain—drain connection layer 31a and the drain—drain connection layer 31b are disposed in parallel with one another. When viewed in plan view, the gate electrode layers 21a and 21b are located between the drain—drain connection layer 31a and the drain—drain connection layer 31b.

{Structure of Memory Cell}

Figure 2:
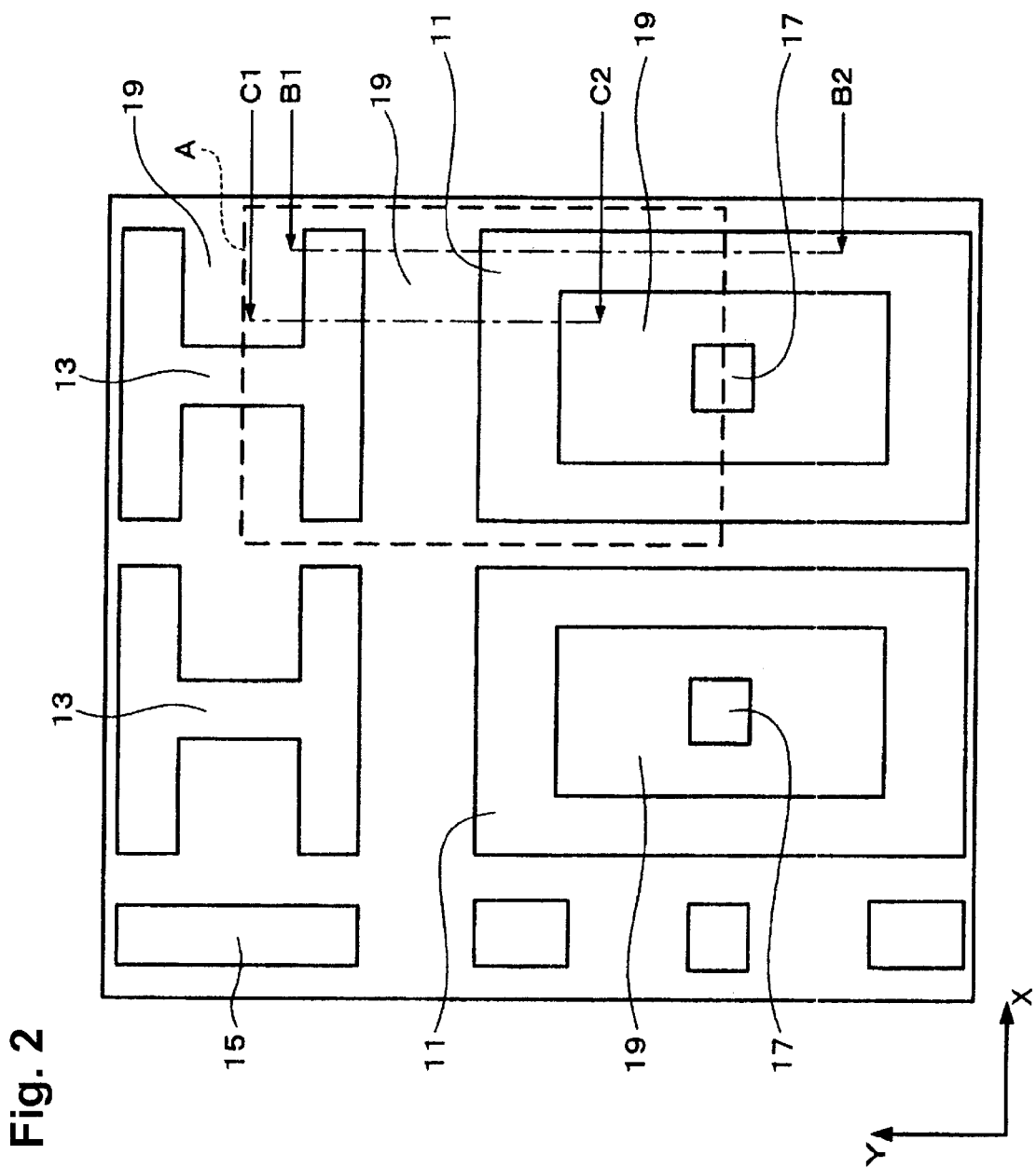
FIG. 2 is a plan view of a field in a part of the memory cell array in accordance with one embodiment of the present invention.
Figure 10:
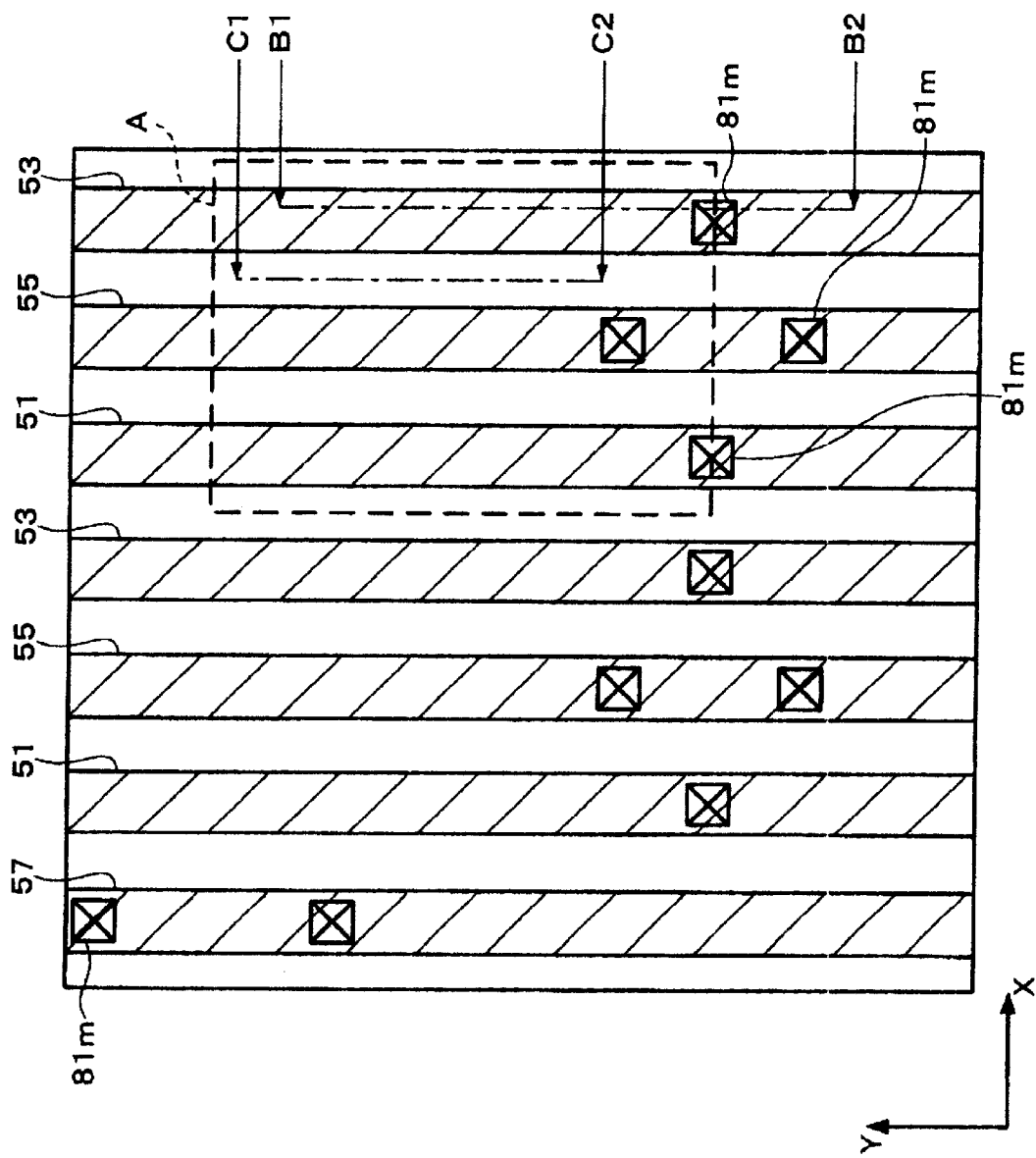
FIG. 10 is a plan view of a fourth conduction layer in a part of the memory cell array in accordance with one embodiment of the present invention.

Next, a structure of the memory cell in accordance with the present embodiment is described. The memory cell of the present embodiment has a structure in which first, second, third and fourth conduction layers are successively stacked in layers over a field with interlayer dielectric layers being interposed between the layers. As shown in FIG. 2, the field is a region where active regions 11, 13, 15 and 17, and element isolation regions 19 are located. The fourth layer is a layer where bit lines 51 and the like are located, as shown in FIG. 10. The memory cell of the present embodiment has a structure in which the first, second and third conduction layers described above with reference to FIG. 1 are positioned over the field shown in FIG. 2, and the fourth conduction layer shown in FIG. 10 is positioned over these layers.

[Detailed Structure of The Embodiment]

Figure 12:
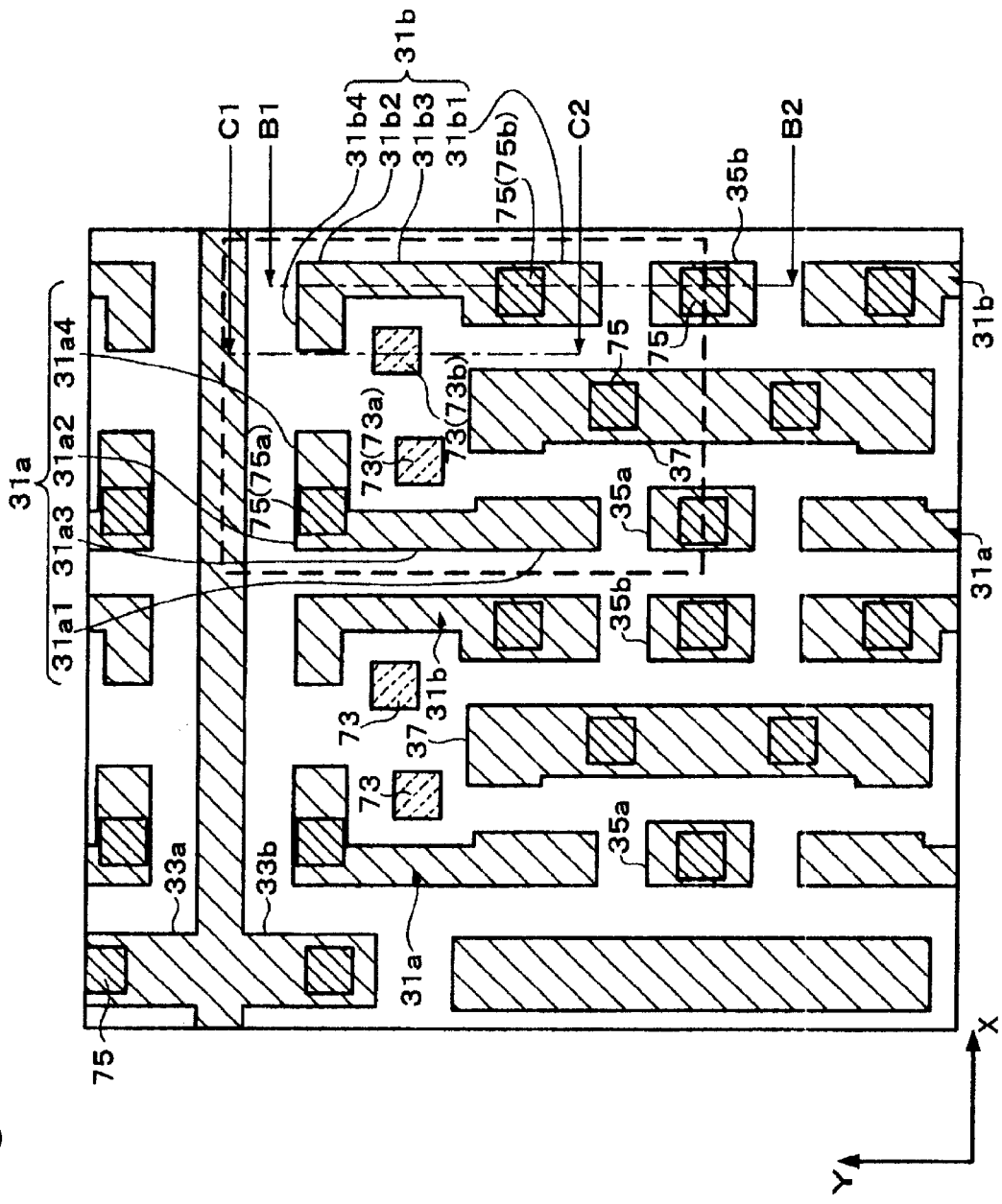
FIG. 12 is a plan view of the second layer and the plugs 73 and 75 in accordance with one embodiment of the present invention.
Figure 13:
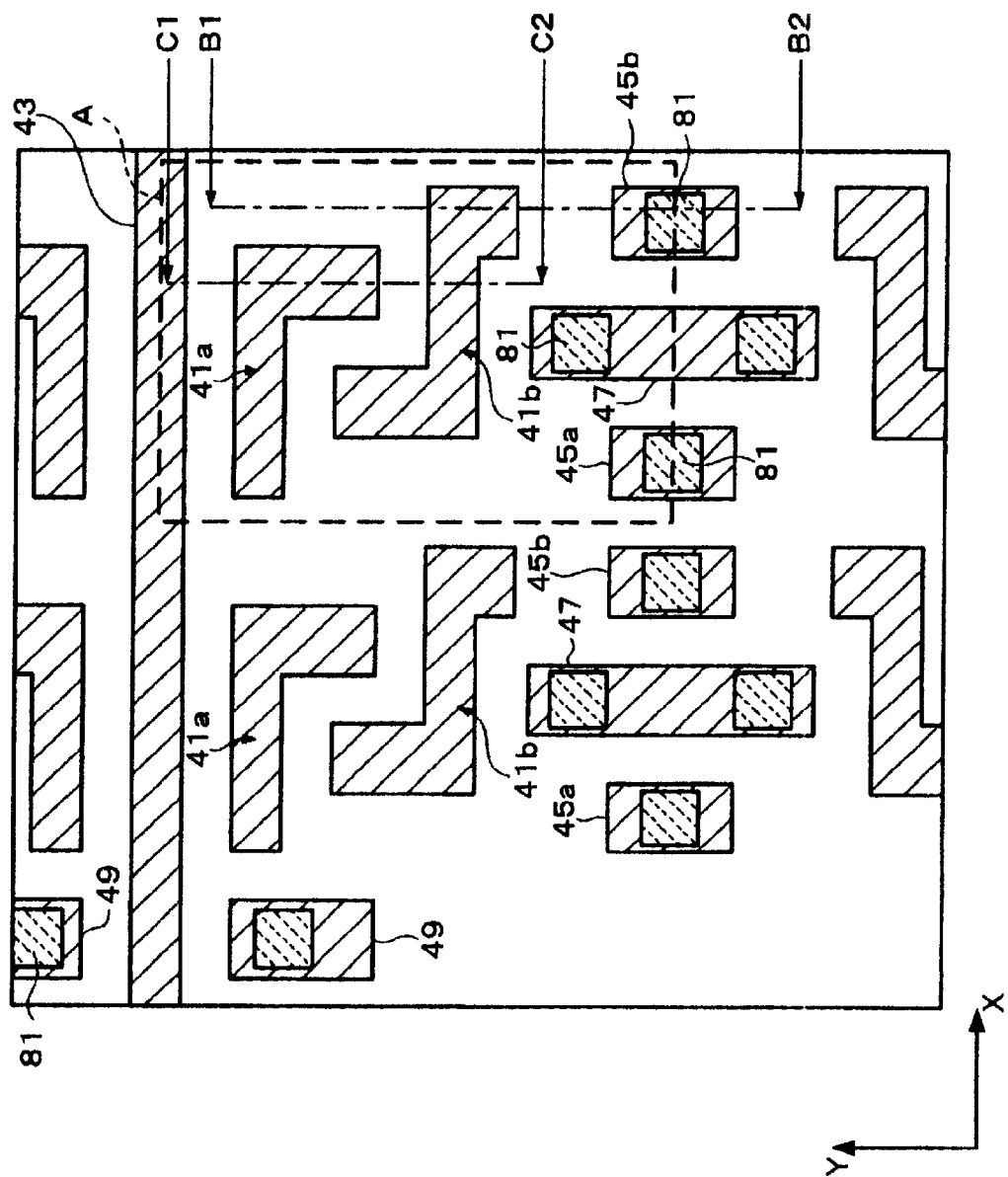
FIG. 13 is a plan view of the third layer and the plug 81 in accordance with one embodiment of the present invention.
Figure 14:
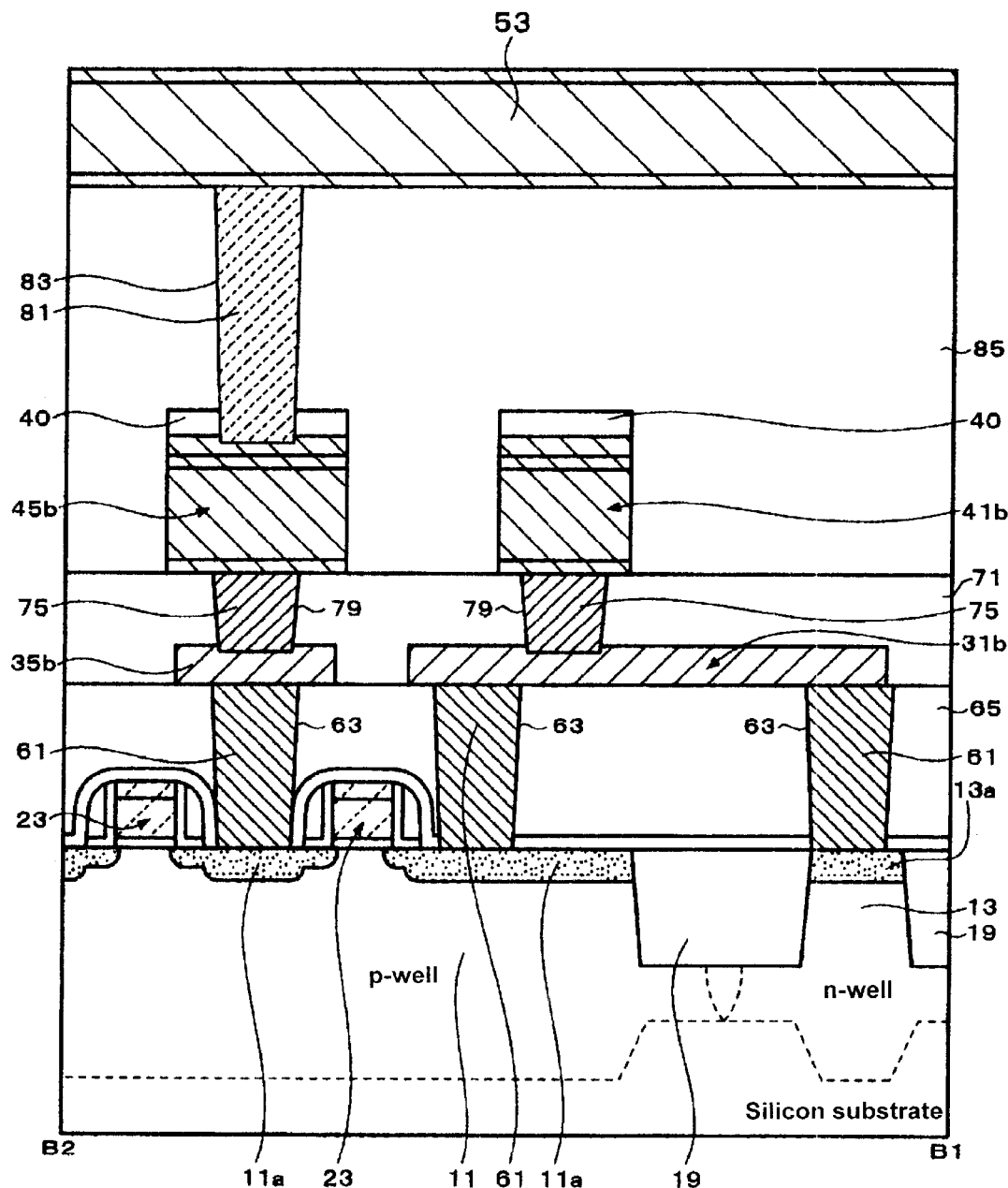
FIG. 14 is a cross-sectional view taken along lines B1–B2 shown in a plan view in accordance with one embodiment of the present invention.
Figure 15:
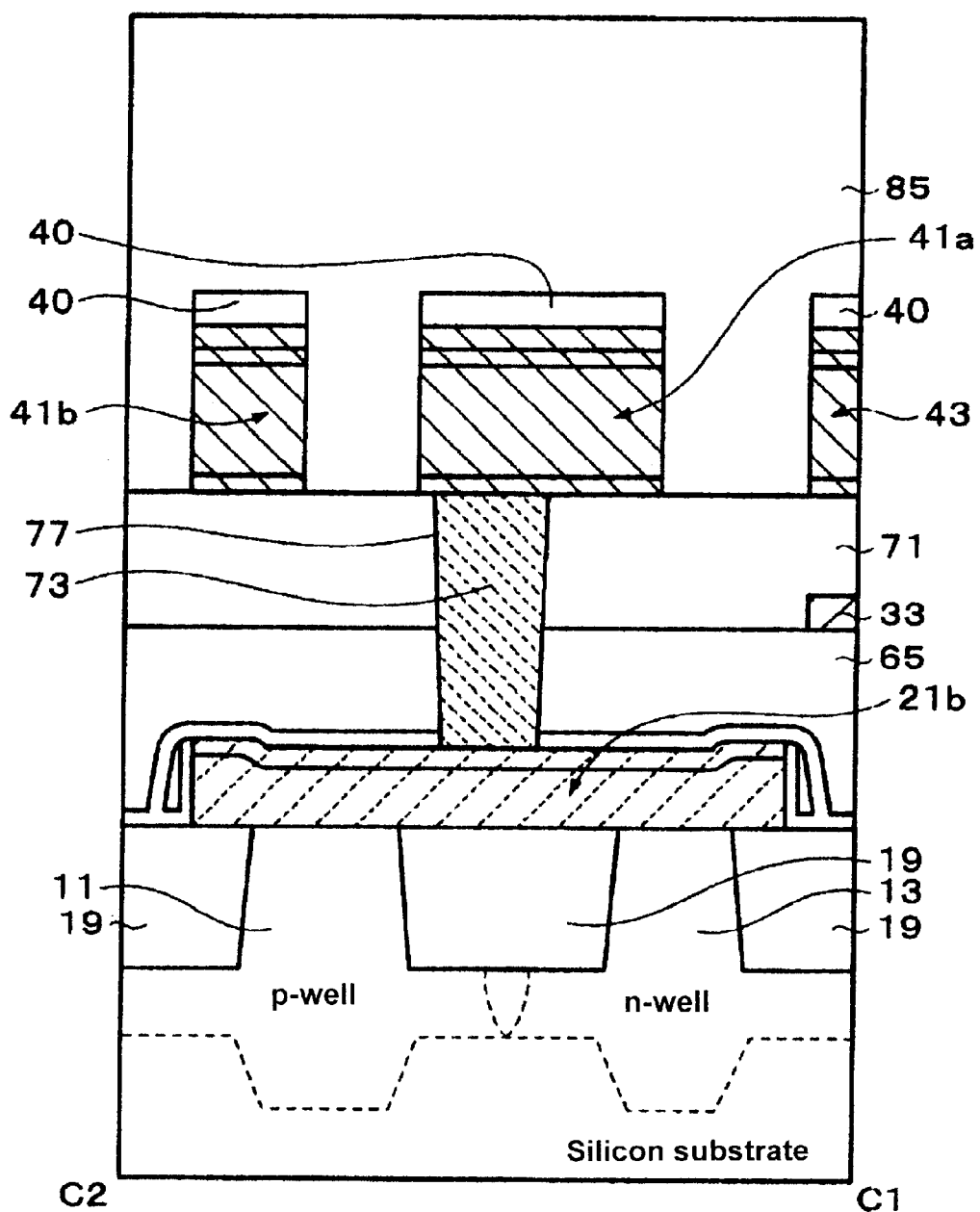
FIG. 15 is a cross-sectional view taken along lines C1–C2 shown in a plan view in accordance with one embodiment of the present invention.

The structure of the present embodiment is described in detail from the perspective of the bottom layer with reference to FIGS. 2–15. FIGS. 2–13 show plane B1–B2, and plane C1–C2. FIG. 14 is a cross-sectional view taken along the plane B1–B2, and FIG. 15 is a cross-sectional view taken along the plane C1–C2.

{Field, First Layer}

Figure 11:
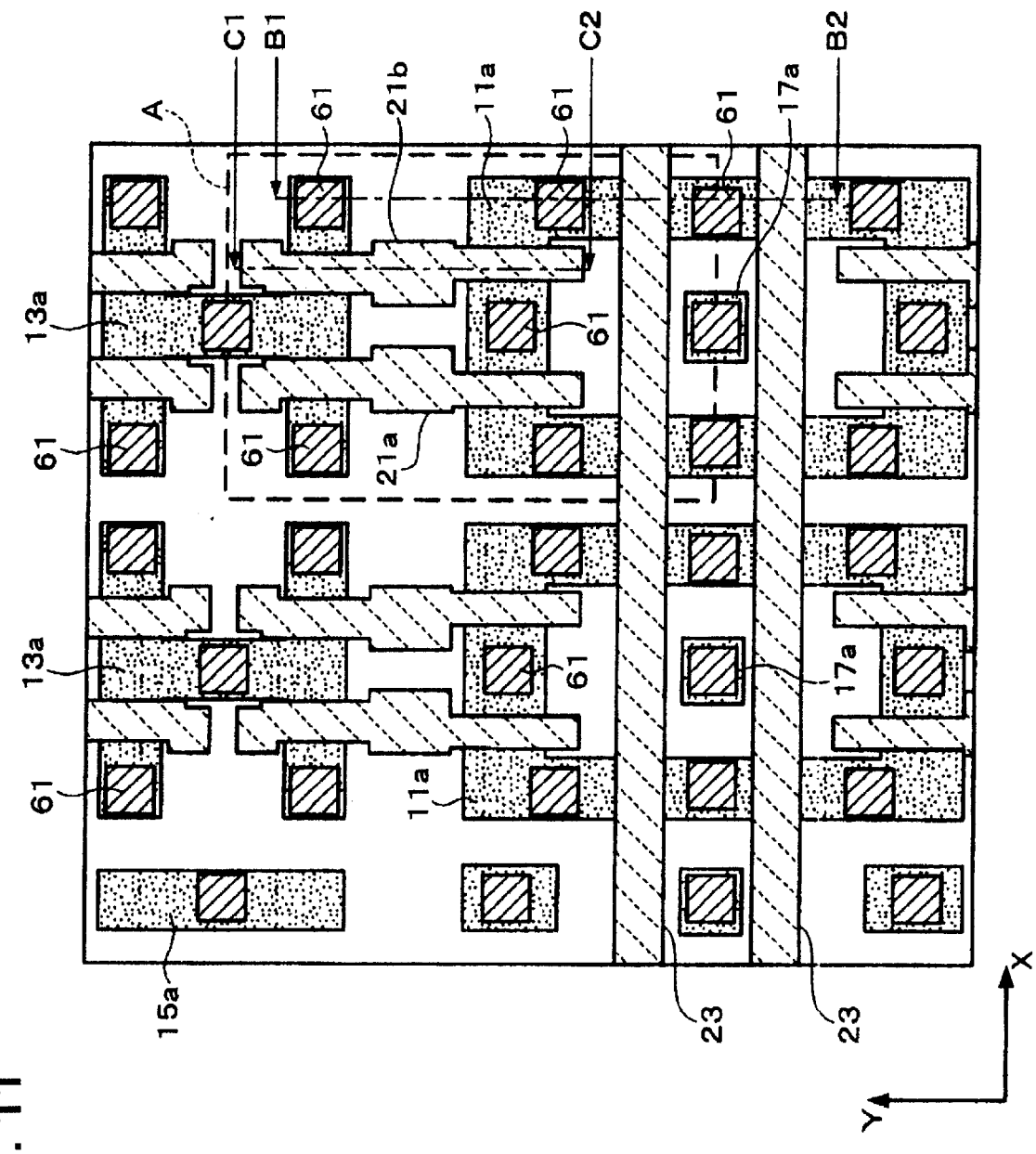
FIG. 11 is a plan view of the field, the first layer and the plug 61 in accordance with one embodiment of the present invention.

FIG. 11 is a plan view of the field and the first conduction layer. First, the field is described with reference to FIGS. 2, 14 and 15. FIG. 2 is a plan view of the field. The field includes active regions 11, 13, 15 and 17, and element isolation regions 19. The active regions 11, 13, 15 and 17 are formed on the surface of a silicon substrate.

The active region 11 has a generally rectangular frame shape. A plurality of the active regions 11 are arranged in the X-axis direction in FIG. 2. The transfer transistors $Q_1$ and $Q_2$ and the driver transistors $Q_3$ and $Q_4$ shown in FIG. 1 are formed in the active region 11.

The active region 13 generally is in a letter-H shape. A plurality of the active regions 13 are arranged in the X-axis direction in FIG. 2. The load transistors $Q_5$ and $Q_6$ shown in FIG. 1 are formed in the active region 13.

Each one of the active regions 15 is formed, for example, for every thirty-two (32) memory cells arranged in the X-axis direction. A well contact region for n-wells is formed in the active region 15. Accordingly, the n-wells corresponding to the thirty-two (32) memory cells are connected to a $V_{DD}$ wiring (power supply line) through the well contact region.

Each one of the active regions 17 is formed, for example, for every two memory cells arranged in the Y-axis direction.

A well contact region for p-wells is formed in the active region 17. Accordingly, the p-wells corresponding to the two memory cells are connected to a $V_{SS}$ wiring (grounding line) through the well contact region.

The active regions 11, 13, 15 and 17 are isolated from other active regions by the element isolation regions 19 (having a depth of, for example, 400 nm). The element isolation regions 19 may be provided by, for example, STI (shallow trench isolation).

Cross-sectional views of the field shown in FIG. 2 taken along the plane B1–B2 and the plane C1–C2 are shown in FIG. 14 and FIG. 15, respectively.

The active regions 11 and 13 and the element isolation regions 19 appear in these cross-sections.

Next, the first layer positioned on the field is described with reference to FIG. 3, FIG. 11, FIG. 14 and FIG. 15. FIG. 3 is a plan view of the first conduction layer. A plurality of gate electrode layers 21a and 21b and a plurality of auxiliary word lines 23 are disposed in the first layer. The gate electrode layers 21a and 21b and the auxiliary word lines 23 have a structure in which, for example, a silicide layer is formed on a polysilicon layer.

Each of the gate electrode layers 21a and 21b has a linear pattern extending in the Y-axis direction in FIG. 3. One pair of the gate electrode layers 21a and 21b is disposed in parallel with each other in each one of the memory cell regions. The gate electrode layers 21a and 21b become gate electrodes of the driver transistors $Q_3$ and $Q_4$ and the load transistors $Q_5$ and $Q_6$ shown in FIG. 1. The gate length of each of the driver transistors $Q_3$ and $Q_4$ is, for example, 0.18 µm, and the gate length of each of the load transistors $Q_5$ and $Q_6$ shown is, for example, 0.20 µm.

Each of the auxiliary word lines 23 has a linear pattern extending in the X-axis direction in FIG. 3. The auxiliary word lines 23 are located on the side of the driver transistors. The auxiliary word lines 23 are activated or inactivated by main word lines located in an upper layer. The auxiliary word lines 23 become gate electrodes of the transfer transistors. The gate length of each of transfer transistors is, for example, 0.24 µm.

Cross-sectional views of the first layer shown in FIG. 3 taken along the plane B1–B2 and the plane C1–C2 are shown in FIG. 14 and FIG. 15, respectively. The auxiliary word lines 23 and the gate electrode layers 21b appear in these cross-sectional views.

Next, source/drain regions and the like that are formed in the active regions are described. As shown in FIG. 11, $n^+$ type source/drain regions 11a are formed in the active regions 11. The "source/drain region" means a region that functions as at least one of a source and a drain. $N^+$ type well contact regions 15a are formed in the active regions 15. $P^+$ type well contact regions 17a are formed in the active regions 17.

Figure 4:
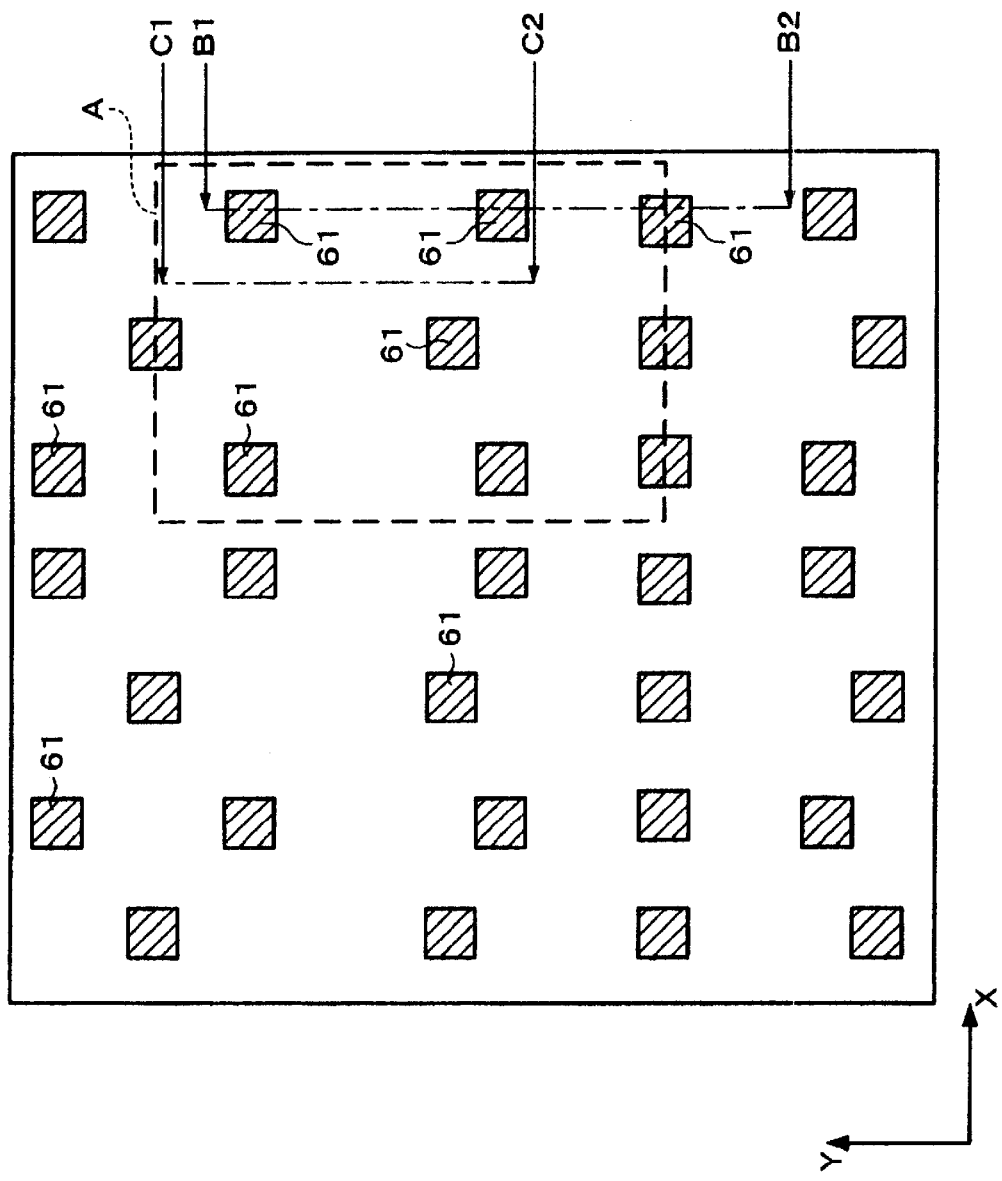
FIG. 4 is a plan view of a plug 61 in a part of the memory cell array in accordance with one embodiment of the present invention.

An interlayer dielectric layer, such as, for example, a silicon oxide layer (not shown in FIG. 11) is formed in a manner to cover the field and the first layer. As shown in FIG. 14 and FIG. 15, the interlayer dielectric layer 65 is processed by CMP for planarization. A plurality of contact holes 63 are formed in the interlayer dielectric layer 65 that expose the $n^+$ type source/drain regions 11a and the like. Plugs 61 are embedded in the contact holes 63. The plugs 61 are connected to the $n^+$ type source/drain regions 11a, the $p^+$ type source/drain regions 13a, the $n^+$ type well contact regions 15a and the $p^+$ type well contact regions 17a. The plugs 61 have patterns as shown in FIG. 4 in plan view. Tungsten, for example, can be used as a material for the plugs 61. The diameter of the contact hole 63 at its upper end section is, for example, 0.30 μm, and at its lower end section is, for example, 0.24 μm.

{Second Layer}

The second layer is structurally located above the structure shown in FIG. 11. As shown in FIG. 5, a plurality of drain—drain connection layers 31a and 31b, $V_{DD}$ wiring 33, a plurality of BL (bit line) contact pad layers 35a and 35b, and a plurality of $V_{SS}$ local wirings 37 are disposed in the second conduction layer. They have a structure in which, for example, a titanium nitride layer (having a thickness of, for example, 135 nm) is formed on an underlying titanium layer (having a thickness of, for example, 8.5 nm). First, the structure of the drain—drain connection layers 31a and 31b is described.

The drain—drain connection layers 31a includes a first contact end section 31 a1, a second contact end section 31a2, a linear section 31a3 and an extension section 31a4. The first contact end section 31a1 is a section that connects to a drain region of the driver transistor $Q_3$. The second contact end section 31a2 is a section that connects to a drain region of the load transistor $Q_5$. The linear section 31a3 linearly extends from the first contact end section 31a1 in the Y-axis direction and reaches the second contact end section 31a2. The extension section 31a4 is a section that extends from the second contact end section 31a2 in the X-axis direction (in a direction toward a location where the drain—drain connection layer 31b is located). The linear section 31a3 has a width that is smaller than the width of either the first contact end section 31a1 or the second contact end section 31a2. The width of the linear section 31a3 is a minimum value on the design rule.

The drain—drain connection layers 31b has a structure similar to that of the drain—drain connection layers 31a. More specifically, the drain—drain connection layers 31b includes a first contact end section 31b1, a second contact end section 31b2, a linear section 31b3 and an extension section 31b4. The first contact end section 31b1 is a section that connects to a drain region of the driver transistor $Q_4$. The second contact end section 31b2 is a section that connects to a drain region of the load transistor $Q_6$. The linear section 31b3 linearly extends from the first contact end section 31b1 in the Y-axis direction and reaches the second contact end section 31b2. The extension section 31b4 is a section that extends from the second contact end section 31b2 in the X-axis direction (in a direction toward a location where the drain—drain connection layer 31a is located). The linear section 31b3 has a width that is smaller than the width of either the first contact end section 31b1 or the second contact end section 31b2. The width of the linear section 31b3 is a minimum value on the design rule.

One set of the drain—drain connection layers 31a and 31b are disposed in every one memory cell region. As shown in FIG. 1, as viewed in plan view, one set of the gate electrode layers 21a and 21b are located between the drain—drain connection layer 31a and the drain—drain connection layer 31b.

The $V_{SS}$ local wiring 37 has end sections and a linear section extending in the Y-axis direction in FIG. 5. The width of the end sections of the $V_{SS}$ local wiring 37 is greater than a width of the linear section of the $V_{SS}$ local wiring 37. The $V_{SS}$ local wiring 37 is located between the first contact end section 31a1 of the drain—drain connection layer 31a and the first contact end section 31b1 of the drain—drain connection layer 31b. From this point, the $V_{SS}$ local wiring 37 extends to an area between the first contact end section 31a1 of the drain—drain connection layer 31a and the first contact end section 31b1 of the drain—drain connection layer 31b of a memory cell located therebelow in FIG. 5. Each one of the $V_{SS}$ local wirings 37 is disposed for every two of the memory cells.

The BL contact pad layer 35a functions as a pad layer to connect the bit line and the $n^+$ type source/drain region 11a (see FIG. 11). Similarly, the BL contact pad layer 35b functions as a pad layer to connect the bit line and the $n^+$ type source/drain region 11a.

The BL contact pad layer 35a is located between the drain—drain connection layer 31a of one memory cell and the drain—drain connection layer 31a of another memory cell located below in FIG. 5. Similarly, the BL contact pad layer 35b is located between the drain—drain connection layer 31b of one memory cell and the drain—drain connection layer 31b of another memory cell located therebelow in FIG. 5. Each one of the BL contact pad layers 35a and 35b is disposed for every two memory cells.

The $V_{DD}$ wiring 33 has a linear pattern extending in the X-axis direction in FIG. 5. The $V_{DD}$ wiring 33 extends three-dimensionally across the $n^+$ type well contact region 15a (see FIG. 11). The $V_{DD}$ wiring 33 has branch sections 33a and 33b above the $n^+$ type well contact region 15a.

The drain—drain connection layers 31a and 31b, the $V_{DD}$ wiring 33, the BL contact pad layers 35a and 35b, and the $V_{SS}$ local wirings 37 located in the second layer shown in FIG. 5 are connected to the plugs 61 shown in FIG. 11. These connected sections are shown in FIG. 5 as contact sections 61m.

FIG. 14 is a cross-sectional view of the second layer shown in FIG. 5 taken along plane B1–B2. The drain—drain connection layer 31b and the BL contact pad layer 35b appear in the cross-sectional view.

An interlayer dielectric layer, such as, for example, a silicon oxide layer (not shown in FIG. 5) is formed in a manner to cover the second layer. As shown in FIG. 14 and FIG. 15, the interlayer dielectric layer 71 is processed by CMP for planarization. A plurality of through holes 79 are formed in the interlayer dielectric layer 71, which expose the drain—drain connection layer 31b and the like, as shown in FIG. 15. Plugs 75 are embedded in the through holes 79. Also, as shown in FIG. 15, through holes 77 are formed in the interlayer dielectric layers 71 and 65, which expose the gate electrode layers 21b. Plugs 73 are embedded in the through holes 77. FIG. 12 is a plan view of the relationships between the plugs 73 and 75 and the second conduction layer.

Figure 6:
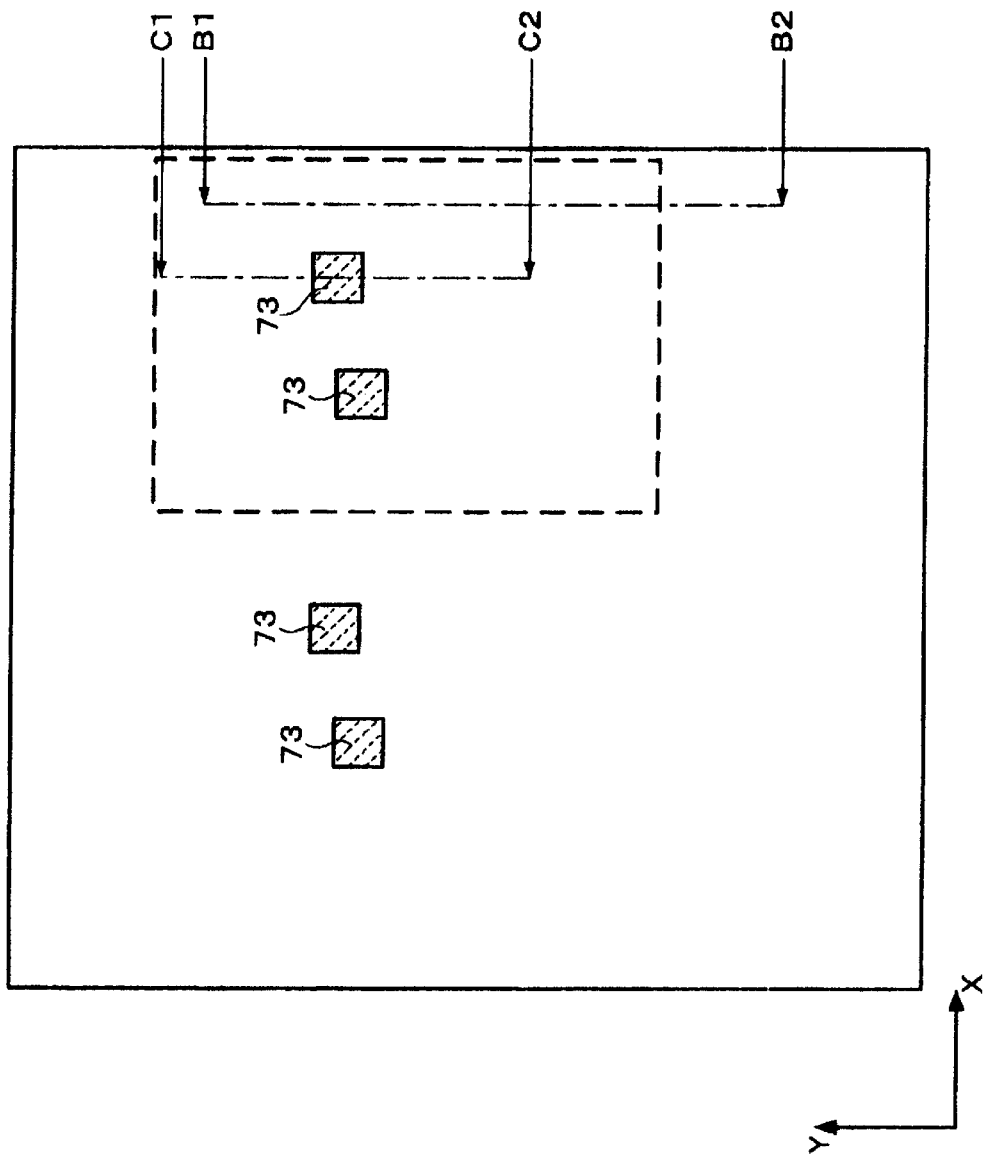
FIG. 6 is a plan view of a plug 73 in a part of the memory cell array in accordance with one embodiment of the present invention.

The plugs 73 are described below. The plugs 73 are disposed in plan view as shown in FIG. 6. The plugs 73 are connected to the gate electrode layers 21a and 21b (see FIG. 3). FIG. 15 is a cross-sectional view of the plug 73 and is described below. The plug 73 is embedded in the through hole 77 that passes through the two interlayer dielectric layers 65 and 71. The plug 73 is connected to the gate electrode layer 21b as shown in this cross-sectional view. Tungsten, for example, can be used as a material of the plugs 73. The diameter of the through hole 77 at its upper end section is, for example, 0.32 μm, and at its lower end section is, for example, 0.24 μm.

Figure 7:
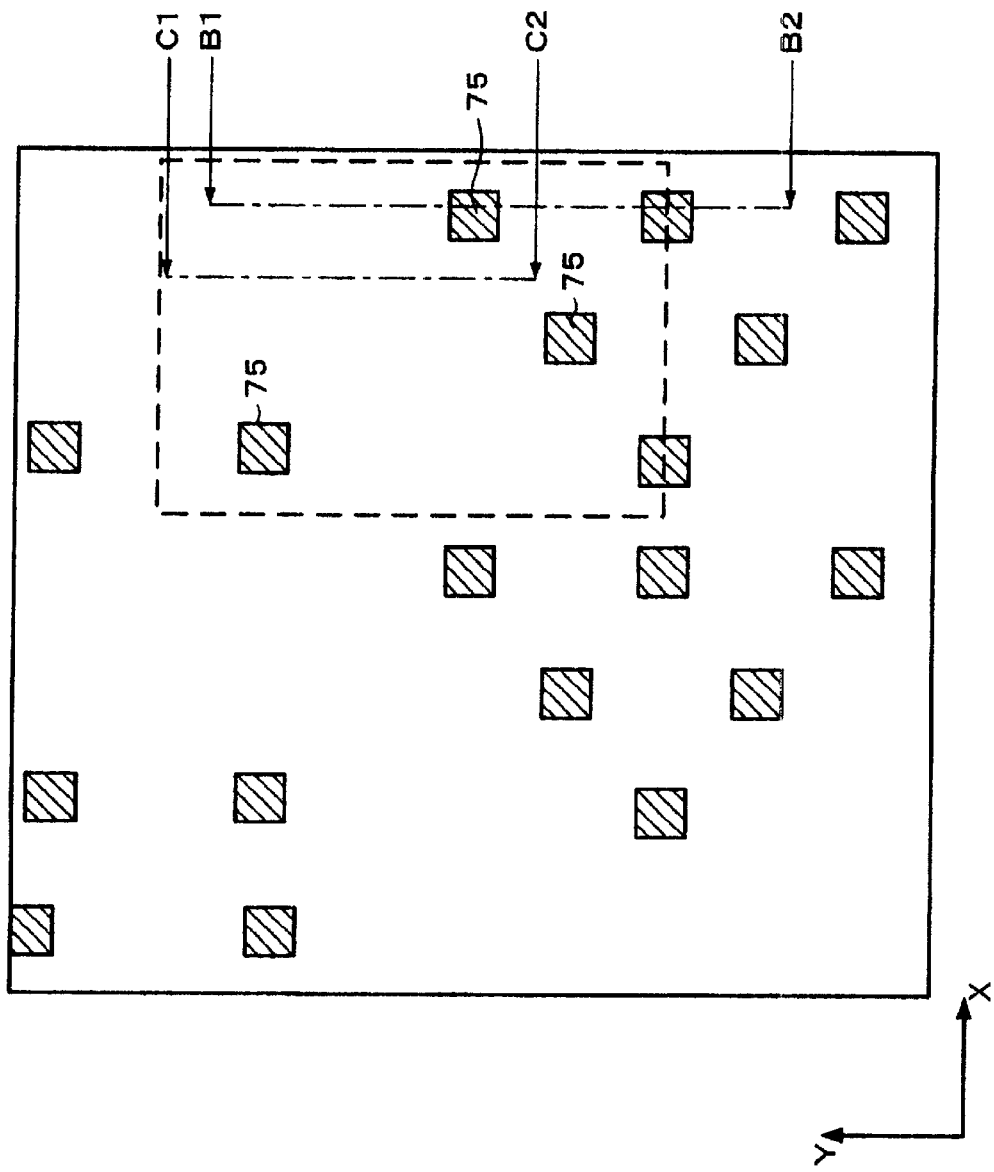
FIG. 7 is a plan view of a plug 75 in a part of the memory cell array in accordance with one embodiment of the present invention.

The plugs 75 are described below. The plugs 75 are disposed in plan view as shown in FIG. 7. As shown in FIG. 12, the plugs 75 are connected to the second contact pad section 31a2 of the drain—drain connection layer 31a, the first contact pad section 31b1 of the drain—drain connection layer 31, the branch sections 33a and 33b of the $V_{DD}$ wiring 33, the BL contact pad layers 35a and 35b, and the $V_{SS}$ local wirings 37. FIG. 14 is a cross-sectional view of the plug 75 and is described below. The plug 75 is embedded in the through hole 79 that passes through the interlayer dielectric layer 71. The plug 75 is connected to the drain—drain connection layer 31b and the BL contact pad layer 35b as shown in this cross-sectional view. Tungsten, for example, can be used as a material of the plugs 75. The diameter of the through hole 79 at its upper end section is, for example, 0.30 μm, and at its lower end section is, for example, 0.24 μm.

{Third Layer}

The third layer is structurally located above the structure shown in FIG. 12. As shown in FIG. 8, a plurality of drain-gate connection layers 41a and 41b, main word lines 43, a plurality of BL contact pad layers 45a and 45b, a plurality of $V_{SS}$ contact pad layers 47, and a plurality of $V_{DD}$ contact pad layers 49 are disposed in the third conduction layer. They have a structure in which, for example, from the bottom layer, a titanium nitride layer, an aluminum-copper alloy layer, a titanium layer and a titanium nitride layer are successively stacked in layers.

The drain-gate connection layer 41a has a linear section 41a3 and two end sections 41a1 and 41a2. The linear section 41a3 is a section that extends in the X-axis direction in FIG. 8. The end section 41a1 is a section that bends toward the side of the drain-gate connection layer 41b. Similarly, the drain-gate connection layer 41b has a linear section 41b3 and two end sections 41b1 and 41b2. The linear section 41b3 is a section that extends in the X-axis direction in FIG. 8. The end section 41b1 is a section that bends toward the side of the drain-gate connection layer 41a. Each set of the drain-gate connection layers 41a and 41b are disposed in each one of the memory cell regions.

The BL contact pad layer 45a functions as a pad layer to connect the bit line and the n⁺ type source/drain region 11a (see FIG. 11). Similarly, the BL contact pad layer 45b functions as a pad layer to connect the bit line and the n⁺ type source/drain region 11a. Each of the BL contact pad layers 45a and 45b is disposed for every two memory cells.

The $V_{SS}$ contact pad layer 47 extends in the Y-axis direction in FIG. 8 and has two end sections. The $V_{SS}$ contact pad layer 47 is located between the BL contact pad layer 45a and the BL contact pad layer 45b. Each one of the $V_{SS}$ contact pad layers 47 is disposed for every two of the memory cells.

The main word line 43 linearly extends in the X-axis direction in FIG. 8. The main word line 43 is located above the $V_{DD}$ wiring 33 shown in FIG. 5. The $V_{DD}$ contact pad layers 49 are located above the branch sections 33a and 33b of the $V_{DD}$ wiring 33 shown in FIG. 5. It is noted that the present embodiment has a structure in which the word lines include the auxiliary word lines 23 (see FIG. 3) and the main word lines 43 (see FIG. 8). However, the present embodiment can have a structure in which main word lines are not provided, and the word lines may be disposed in places of the auxiliary word lines.

The end section 41a1 of the drain-gate connection layer 41a and the end section 41b1 of the drain-gate connection layer 41b are connected to the plugs 73 shown in FIG. 12, respectively. These connected sections are shown in FIG. 8 as contact sections 73m. The end section 41a2 of the drain-gate connection layer 41a, the end section 41b2 of the drain-gate connection layer 41b, the BL contact pad layers 45a and 45b, the $V_{SS}$ contact pad layer 47 and the $V_{DD}$ contact pad layer 49 are connected to the plugs 75 shown in FIG. 12. These connected sections are shown in FIG. 8 as contact sections 75m.

FIGS. 14 and 15 are cross-sectional views of the third layer shown in FIG. 3 taken along plane B1–B2 and plane C1–C2, respectively. The drain-gate connection layers 41a and 41b, the BL contact pad layer 45b and the main word line 43 appear in these cross-sectional views. A hard mask layer 40 formed of a silicon oxide layer is formed on the third conduction layer including these layers. The third conduction layer is patterned using the hard mask layer 40. This is performed because it is difficult to pattern the third conduction layer using only a resist as a mask due to the miniaturized memory cell.

An interlayer dielectric layer, such as, for example, a silicon oxide layer is formed in a manner to cover the third layer. As shown in FIG. 14 and FIG. 15, the interlayer dielectric layer 85 is processed by CMP for planarization. A plurality of through holes 83 are formed in the interlayer dielectric layer 85, which expose the BL contact pad layers 45a and the like. Plugs 81 are embedded in the through holes 83. They are shown in a plan view in FIG. 13. As shown in FIG. 13, the plugs 81 are connected to the BL contact pad layers 45a and 45b, the $V_{SS}$ contact pad layer 47 and $V_{DD}$ contact pad layer 49. The plugs 81 have patterns shown in plan view of FIG. 9. Tungsten, for example, can be used as a material for the plugs 81. The diameter of the through hole 83 at its upper end section is, for example, 0.36 μm, and at its lower end section is, for example, 0.28 μm.

{Fourth Layer}

The fourth layer is structurally located above the structure shown in FIG. 13. As shown in FIG. 10, a plurality of bit lines 51, a plurality of bit lines 53, a plurality of $V_{SS}$ wirings 55 and the $V_{DD}$ wirings 57 are disposed in the fourth layer. The $V_{SS}$ wiring 55 is interposed between the bit line 51 and the bit line 53, and disposed in a center of the cell. Each one of the $V_{DD}$ wirings 57 is disposed for, for example, every thirty two (32) memory cells arranged in the X-axis direction. They linearly extend in the Y-axis direction in FIG. 10. The are connected to the plugs 81 shown in FIG. 13. The connected sections are shown in FIG. 10 as contact sections 81m. The bit lines 51 have a structure in which, for example, from the bottom layer, a titanium nitride layer, an aluminum-copper alloy layer, and a titanium nitride layer are successively stacked in layers.

FIG. 14 is a cross-sectional view of the fourth layer shown in FIG. 10 taken along plane B1–B2. The bit line 53 appears in the cross-sectional view. A signal that is complementary to the signal flown through the bit line 51 flows through the bit line 53. The above description provides a detailed structure of the embodiment of the present invention.

It is noted that the patterns shown in FIGS. 1 through 13 are designed patterns. These patterns have corner sections. However, patterns that are actually formed on a semiconductor substrate have curved lines that define the corner sections due to the light proximity effect.

[Advantages of the Present Embodiment]

Advantages of the present embodiment are described below.

{1} As shown in FIG. 5, the drain—drain connection layer 31a has the extension section 31a4 extending in the X-axis direction next to the second contact end section 31a2. Similarly, the drain—drain connection layer 31b has the extension section 31b4 extending in the X-axis direction next to the second contact end section 31b2. Generally, when an end section of a wiring has a narrow width, its resist pattern is rounded and receding occurs in the pattern. In particular, when the exposure is out of focus, losses in the end section pattern may occur. When a contact is located at such an end section of the wiring, the contact enclosure (the coverage of the wiring over the contact hole) is reduced, which causes various reliability-related problems, such as an increased connection resistance, deterioration in the contact migration, cuts (cavities) in the contact, and similar problems. When the loss is large, other problems may occur; for example, the connection may open.

In accordance with the present embodiment, since the extension sections 31a4 and 31b4 are provided, the second contact end sections 31a2 and 31b2 have a high processing reproducibility, recessions and losses of patterns can be prevented. Also, the enclosure of contacts (e.g., the plugs 61 of the drain regions of the load transistors) located at the second contact end sections 31a2 and 31b2 can be prevented from being deteriorated. Accordingly, in accordance with the present embodiment, the processing margin for wirings and the reliability of the wirings can be enhanced.

{2} As shown in FIG. 5, since the drain—drain connection layer 31a has the extension section 31a4, a light proximity effect correction device (for example, a fine correction pattern such as a shelf, a jog or the like) does not need to be added to the second contact end sections 31a2 of the drain—drain connection layer 31a. Similarly, since the drain—drain connection layer 31b has the extension section 31b4, a light proximity effect correction device (for example, a fine correction pattern such as a shelf, a jog or the like) does not need to be added to the second contact end sections 31b2 of the drain—drain connection layer 31b. Accordingly, in accordance with the present embodiment, the correction of light proximity effect can be lightened. As a result, the period for developing SRAMs can be shorted, and the development cost can be lowered.

In accordance with the present embodiment, as shown in FIG. 5, another conduction layer is not located between the extension section 31a4 of the drain—drain connection layer 31a and the extension section 31b4 of the drain—drain connection layer 31b. As a result, the extension sections 31a4 and 31b4 can be formed without enlarging the area of the memory cell.

{3} As shown in FIG. 12, in accordance with the present embodiment, the plug 75a connects the drain—drain connection layer 31a and the drain-gate connection layer 41a (see FIG. 13), and the plug 73b connects the drain-gate connection layer 41a (see FIG. 13) and the gate electrode layer 21b (see FIG. 3). Similarly, the gate electrode layer 21a, the drain—drain connection layer 31b and the drain-gate connection layer 41b are connected by the plugs 75b and the plugs 73a.

The positions of the plug 75a, the plug 73b, the plug 75b and the plug 73a are separated from the cell center and from one another diagonally across the cell center. Accordingly, each of the drain-gate connection layers 41a and 41b can be formed in an L-letter shape. As a result, in accordance with the present embodiment, the drain-gate connection layers 41a and 41b can be formed in simple shapes. Thus, while the cell area is reduced, the processing rule for making the drain-gate connection layers 41a and 41b can be lightened.

Also, in accordance with the present embodiment, the extension section 31a4 of the drain—drain connection layer 31a is longer than the extension section 31b4 of the drain—drain connection layer 31b, and the first contact end section 31b1 of the drain—drain connection layer 31b is wider than the first contact end section 31a1 of the drain—drain connection layer 31a. The extension section 31a4 and the first contact end section 31b1 are sections where the plugs 75a and 75b are disposed, respectively. Accordingly, in accordance with the present embodiment, the enclosures of the plugs 75a and 75b can be further expanded to thereby make margins for position alignment greater.

It is noted that, as shown in FIG. 8 and FIG. 12, in accordance with the present embodiment, the drain—drain connection layer 31a and the drain-gate connection layer 41a are connected to each other at the second contact section 31a2 of the drain—drain connection layer 31a. Further, the drain—drain connection layer 31b and the drain-gate connection layer 41b are connected to each other at the first contact section 31b1 of the drain—drain connection layer 31b. However, the present invention is not limited to this embodiment, and the following modification can be made. For example, the drain—drain connection layer 31a and the drain-gate connection layer 41a may be connected at the first contact section 31a1 of the drain—drain connection layer 31a. Further, the drain—drain connection layer 31b and the drain-gate connection layer 41b may be connected to each other at the second contact section 31b2 of the drain—drain connection layer 31b.

It is noted that the extension section 31a4 of the drain—drain connection layer 31a is made longer in the X-axis direction than the extension section 31b4 of the drain—drain connection layer 31b to facilitate the position alignment in the X-axis direction when the plug 75a is connected to the drain—drain connection layer 31a. Therefore, in the above modified embodiment, the extension section 31b4 of the drain—drain connection layer 31b is made longer in the X-axis direction than the extension section 31a4 of the drain—drain connection layer 31a.

{4} In accordance with the present embodiment, the size of an SRAM can be reduced because of the following reasons. In accordance with the present embodiment, data is stored by the flip-flops of the memory cells. A flip-flop is formed by connecting an input terminal (a gate electrode) of one inverter to an output terminal (a drain) of the other inverter, and connecting an input terminal (a gate electrode) of the other inverter to an output terminal (a drain) of the one inverter. In other words, a flip-flop cross-couples a first inverter and a second inverter. Therefore, when a flip-flop is formed with two layers, for example, drain—drain connection layers that connect drains of inverters, and drain-gate connection layers that connect gates of the inverters to the drains of the inverters, may be formed in one conduction layer to allow cross-couple connections.

However, in the structure described above, the conduction layer is formed extending across a region where the drains of one inverter are located, a region where the gates of the other inverter are located and a region that connects these regions. The conduction layer may have a pattern having three end sections (for example, a pattern having branch sections such as a T-letter shape or an h-letter shape) or spiral patterns with their arm sections intertwined. For example, patterns having a T-letter shape are described in FIG. 1 of Japanese patent application laid-open No. 10–41409. Patterns having an h-letter shape are described, for example, in FIG. 4(b) on page 201 of *IEDM Tech. Digest* (1998) by Ishida, et al. Patterns having a spiral shape are described in FIG. 3(b) on page 201 of *IEDM Tech. Digest* (1998) by Ishida, et al. Such complicated patterns are difficult to accurately reproduce required shapes in the photo-etching process as the patterns are miniaturized, and cannot provide the required patterns and therefore become a hindrance to an attempt to reduce the memory cell size.

In accordance with the present embodiment, as shown in FIG. 1, gate electrode layers (21a and 21b) that define gates of CMOS inverters, drain—drain connection layers (31a and 31b) that connect drains of the CMOS inverters, and drain-gate connection layers (41a and 41b) that connect gates of one of the CMOS inverters and the drains of the other of the CMOS inverters are formed in different layers, respectively. Therefore, three layers are used to form a flip-flop. As a result, patterns in each layer can be simplified (for example, into linear shapes) compared to the case in which two layers are used to form a flip-flop. In this manner, in accordance with the present invention, since patterns in each layer can be simplified, for example, a miniaturized SRAM having a memory cell size of 4.5 $\mu m^2$ can be manufactured in the 0.18 $\mu m$ process generation.

What is claimed is:

1. A semiconductor memory device, comprising:
   a memory cell that includes a first driver transistor, a second driver transistor, a first load transistor, a second load transistor, a first transfer transistor and a second transfer transistor;
   a first drain—drain connection layer; and
   a second drain—drain connection layer,
   wherein the first drain—drain connection layer connects a drain region of the first driver transistor and a drain region of the first load transistor,
   the second drain—drain connection layer connects a drain region of the second driver transistor and a drain region of the second load transistor,
   each of the first drain—drain connection layer and the second drain—drain connection layer includes a first contact end section, a second contact end section, a linear section and an extension section,
   the first contact end section of the first drain—drain connection layer is a portion that connects to the drain region of the first driver transistor,
   the second contact end section of the first drain—drain connection layer is a portion that connects to the drain region of the first load transistor,
   the linear section of the first drain—drain connection layer is a portion that linearly extends from the first contact end section of the first drain—drain connection layer and reaches the second contact end section of the first drain—drain connection layer,
   the extension section of the first drain—drain connection layer is a portion that extends from the second contact end section of the first drain—drain connection layer in a direction toward a location where the second drain—drain connection layer is located,
   the first contact end section of the second drain—drain connection layer is a portion that connects to the drain region of the second driver transistor,
   the second contact end section of the second drain—drain connection layer is a portion that connects to the drain region of the second load transistor,
   the linear section of the second drain—drain connection layer is a portion that linearly extends from the first contact end section of the second drain—drain connection layer and reaches the second contact end section of the second drain—drain connection layer, and
   the extension section of the second drain—drain connection layer is a portion that extends from the second contact end section of the second drain—drain connection layer in a direction toward a location where the first drain—drain connection layer is located.

2. The semiconductor memory device according to claim 1, further including another conduction layer that is not located between the extension section of the first drain—drain connection layer and the extension section of the second drain—drain connection layer.

3. The semiconductor memory device according to claim 1, a distance between the first contact end section of the first drain—drain connection layer and the first contact end section of the second drain—drain connection layer being longer than a distance between the extension section of the first drain—drain connection layer and the extension section of the second drain—drain connection layer.

4. The semiconductor memory device according to claim 1, further comprising a first gate electrode layer, a second gate electrode layer, a first drain-gate connection layer and a second drain-gate connection layer,
   wherein the gate electrode layers, the drain—drain connection layers and the drain-gate connection layers are located in different layers,
   in plan view, the first gate electrode layer and the second gate electrode layer are located between the first drain—drain connection layer and the second drain—drain connection layer,
   the first gate electrode layer includes a gate electrode of the first driver transistor and a gate electrode of the first load transistor,
   the second gate electrode layer includes a gate electrode of the second driver transistor and a gate electrode of the second load transistor,
   the first drain-gate connection layer connects the first drain—drain connection layer and the second gate electrode layer, and
   the second drain-gate connection layer connects the second drain—drain connection layer and the first gate electrode layer.

5. The semiconductor memory device according to claim 4, wherein:
   the first drain—drain connection layer is connected to the first drain-gate connection layer at the second contact end section of the first drain—drain connection layer, and
   the second drain—drain connection layer is connected to the second drain-gate connection layer at the first contact end section of the second drain—drain connection layer.

6. The semiconductor memory device according to claim 5, wherein
   the first contact end section of the second drain—drain connection layer is wider than the first contact end section of the first drain—drain connection layer, and
   the extension section of the second drain—drain connection layer is shorter than the extension section of the first drain—drain connection layer.

7. The semiconductor memory device according to claim 4, wherein
   the first drain—drain connection layer is connected to the first drain-gate connection layer at the first contact end section of the first drain—drain connection layer, and
   the second drain—drain connection layer is connected to the second drain-gate connection layer at the second contact end section of the second drain—drain connection layer.

8. The semiconductor memory device according to claim 7, wherein
   the first contact end section of the first drain—drain connection layer is wider than the first contact end section of the second drain—drain connection layer, and
   the extension section of the first drain—drain connection layer is shorter than the extension section of the second drain—drain connection layer.

9. The semiconductor memory device according to claim 4, wherein each of the first gate electrode layer and the second gate electrode layer has a linear pattern, and wherein the first gate electrode layer, the second gate electrode layer, the linear section of the first drain—drain connection layer, and the linear section of the second drain—drain connection layer are disposed in parallel with one another.

10. The semiconductor memory device according to claim 4, wherein:

the first and second driver transistors are n-type, the first and second load transistors are p-type, and the first and second transfer transistors are n-type, and further comprising first, second, third and fourth conduction layers, wherein the first gate electrode layer, the second gate electrode layer and an auxiliary word line are located in the first conduction layer, the first drain—drain connection layer, the second drain—drain connection layer, a power supply line, a first contact pad layer, a second contact pad layer and a third contact pad layer are located in the second conduction layer, the first drain-gate connection layer, the second drain-gate connection layer, a main word line, a fourth contact pad layer, a fifth contact pad layer and a sixth contact pad layer are located in the third conduction layer, a first bit line, a second bit line and a grounding line are located in the fourth conduction layer, the auxiliary word line extends in a first direction, the power supply line connects to source regions of the load transistors, the first contact pad layer is used to connect the first bit line and a source/drain region of the first transfer transistor, the second contact pad layer is used to connect the second bit line and a source/drain region of the second transfer transistor, the third contact pad layer is used to connect source regions of the driver transistors and the grounding line, the main word line extends in the first direction, the fourth contact pad layer is used to connect the first bit line and the source/drain region of the first transfer transistor, the fifth contact pad layer is used to connect the second bit line and the source/drain region of the second transfer transistor, the sixth contact pad layer is used to connect the source regions of the driver transistors and the grounding line, and the first and second bit lines extend in a second direction which is perpendicular to the first direction.

11. The semiconductor memory device according to claim 1, wherein the memory cell has a size of 4.5 $\mu m^2$ or less.

* * * * *